(12) United States Patent
Ozawa

(10) Patent No.: US 9,013,914 B2
(45) Date of Patent: Apr. 21, 2015

(54) SEMICONDUCTOR MEMORY DEVICE AND METHOD FOR CONTROLLING SEMICONDUCTOR MEMORY DEVICE

(71) Applicant: Fujitsu Semiconductor Limited, Yokohama-shi, Kanagawa (JP)

(72) Inventor: Takashi Ozawa, Kasugai (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 13/966,422

(22) Filed: Aug. 14, 2013

(65) Prior Publication Data

US 2014/0056057 A1 Feb. 27, 2014

(30) Foreign Application Priority Data

Aug. 21, 2012 (JP) .................................. 2012-182544

(51) Int. Cl.
G11C 11/419 (2006.01)
G11C 11/412 (2006.01)
G11C 8/08 (2006.01)
G11C 11/413 (2006.01)

(52) U.S. Cl.
CPC ............. *G11C 11/419* (2013.01); *G11C 11/412* (2013.01); *G11C 8/08* (2013.01); *G11C 11/413* (2013.01); *G11C 2207/002* (2013.01)

(58) Field of Classification Search
CPC ... G11C 11/412; G11C 11/413; G11C 11/419
USPC ........................................................ 365/154
See application file for complete search history.

(56) References Cited

U.S. PATENT DOCUMENTS

| 6,307,772 | B1* | 10/2001 | Nagaoka | 365/154 |
| 7,817,486 | B2* | 10/2010 | Koike | 365/203 |
| 2009/0323400 | A1 | 12/2009 | Shinozaki | |

FOREIGN PATENT DOCUMENTS

| JP | 11-45578 A | 2/1999 |
| JP | 2010-9674 A | 1/2010 |
| JP | 2012-109022 A | 6/2012 |
| WO | WO 2009/041471 A1 | 2/2009 |

OTHER PUBLICATIONS

Korean Office Action issued Nov. 25, 2014; Application 10-2013-0098062, with English Translation.

* cited by examiner

*Primary Examiner* — Huan Hoang
*Assistant Examiner* — Tri Hoang
(74) *Attorney, Agent, or Firm* — Arent Fox LLP

(57) ABSTRACT

A semiconductor memory device includes word lines, bit line pairs intersecting the word lines, and memory cells arranged where the word lines and the bit line pairs intersect. A word line driver arranged in correspondence with one of the word lines outputs a first voltage or a second voltage. A potential detection circuit is arranged in correspondence with at least one bit line pair to detect the potential at the bit line pair and generate a detection signal. A word line voltage adjustment circuit changes the output voltage of the word line driver from the first voltage to the second voltage in accordance with the detection signal from the potential detection circuit. A sense amplifier amplifies a potential difference of a selected one of the bit line pairs for access.

13 Claims, 10 Drawing Sheets

US 9,013,914 B2

SEMICONDUCTOR MEMORY DEVICE AND METHOD FOR CONTROLLING SEMICONDUCTOR MEMORY DEVICE

CROSS-REFERENCE TO RELATED APPLICATIONS

This application is based upon and claims the benefit of priority from prior Japanese Patent Application No. 2012-182544, filed on Aug. 21, 2012, the entire contents of which are incorporated herein by reference.

FIELD

The present disclosure relates to a semiconductor memory device and a method for controlling a semiconductor memory device.

BACKGROUND

A static random access memory (SRAM) is one type of a semiconductor memory device. An SRAM includes memory cells that store data. The memory cells are arranged in matrix form. The SRAM includes a plurality of word lines extending in a row direction of the memory cells and a plurality of bit line pairs extending in a column direction of the memory cells. Each memory cell is coupled to a corresponding word line and a corresponding bit line pair.

The SRAM activates one of the word lines in response to an address signal. The activation of the word line turns ON an accessed transistor. The SRAM also selects one of the bit line pairs in response to the address signal. The memory cell, which is coupled to the turned ON accessed transistor and the selected bit line pair, becomes the subject of access. The SRAM performs a write operation and a read operation on the accessed memory cell.

As described above, the memory cells arrayed in the row direction are coupled to one corresponding word line. Therefore, when one word line is activated, memory nodes of the memory cells coupled to that word line are coupled to the corresponding bit line pairs. Among the memory cells coupled to the activated word line, the potential at the memory node of the memory cell coupled to a non-selected bit line pair may be inverted by the potential at the corresponding bit line pair. That is, the stored data in the memory cell coupled to the non-selected bit line pair may become corrupted.

To obviate the corruption of data, WO 2009/041471 describes the coupling of a sense amplifier to each bit line pair. In this method, for example, during a write operation, the sense amplifier sets the potential at each bit line pair to a power supply voltage at the high potential side and a power supply voltage at the low potential side. Then, a write amplifier changes the potential at the selected bit line pair in accordance with the input data. In this manner, the sense amplifier is used so that the potential at each bit line pair corresponds to the level held by the memory cell. This prevents data inversion of the memory cell.

In the method described above, however, a sense amplifier is coupled to each bit line pair, and the sense amplifiers are all driven whenever a read operation or a write operation is performed. This increases the power consumption of the semiconductor memory device.

SUMMARY

One aspect of this disclosure is a semiconductor memory device including a plurality of word lines. A plurality of bit line pairs intersect the word lines. A plurality of memory cells are arranged in correspondence with positions where the word lines and the bit line pairs intersect. A word line driver is arranged in correspondence with one of the word lines. The word line driver outputs a first voltage or a second voltage that is higher than the first voltage. A potential detection circuit is arranged in correspondence with at least one of the bit line pairs. The potential detection circuit detects a potential at the at least one bit line pair and generates a detection signal. A word line voltage adjustment circuit changes an output voltage of the word line driver from the first voltage to the second voltage in accordance with the detection signal from the potential detection circuit. A sense amplifier amplifies a potential difference of a selected one of the bit line pairs for access.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The embodiment, together with objects and advantages thereof, may best be understood by reference to the following description of the presently preferred embodiments together with the accompanying drawings in which.

DETAILED DESCRIPTION OF THE EMBODIMENTS

A first embodiment will now be described with reference to FIGS. 1 to 4.

Figure 1:
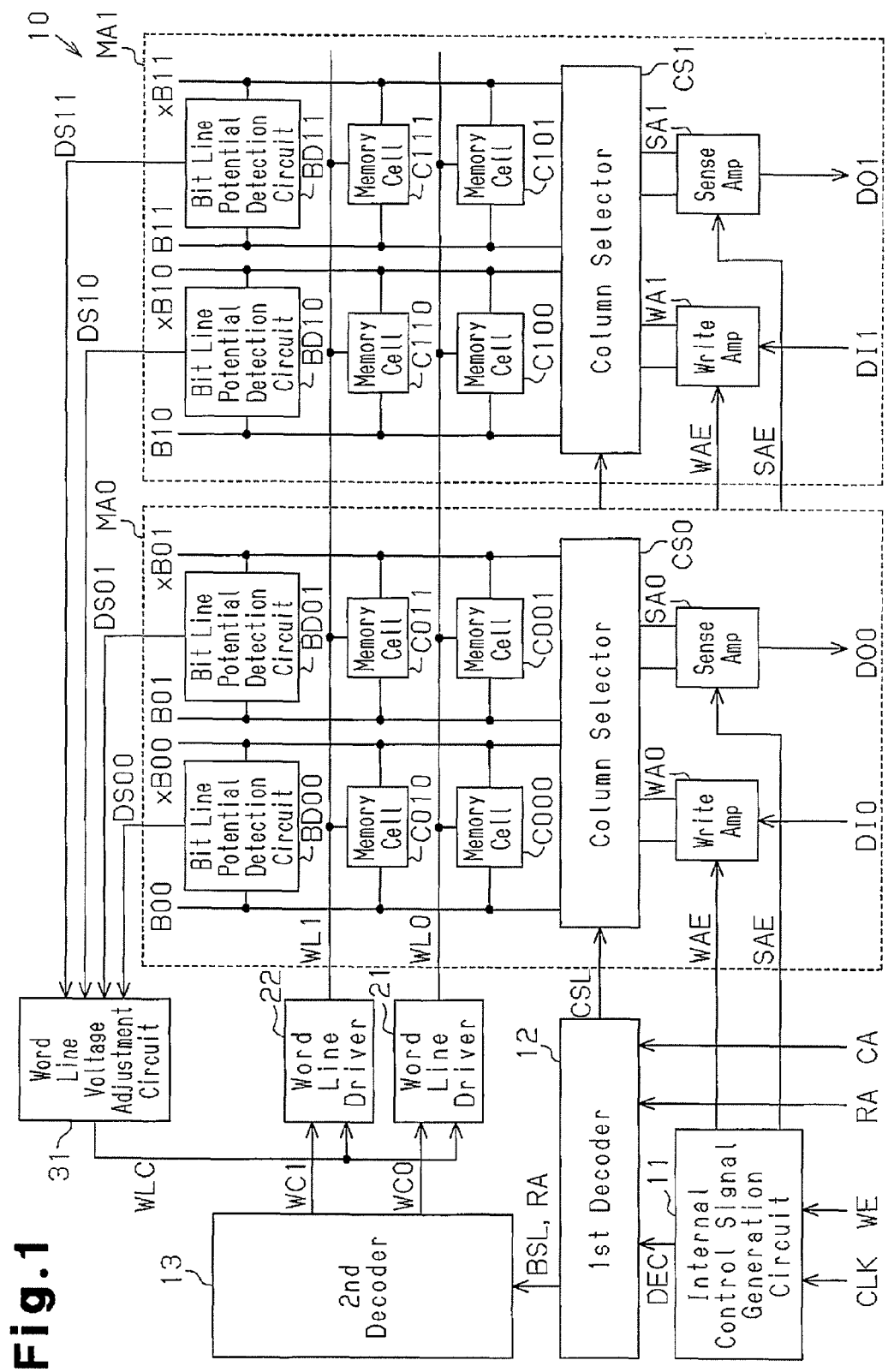
FIG. 1 is a block diagram of a semiconductor memory device in a first embodiment.

As illustrated in FIG. 1, a semiconductor memory device 10 performs a write operation and a read operation on a memory cell selected as the subject of access based on a write enable signal WE, a clock signal CLK, a row address signal RA, and a column address signal CA.

The write enable signal WE and the clock signal CLK are provided to an internal control signal generation circuit 11, and the row address signal RA and the column address signal CA are provided to a first decoder 12. The clock signal CLK is a pulse signal of a given cycle. The write enable signal WE is activated when data is written to the semiconductor memory device 10. The internal control signal generation circuit 11 generates a decoder control signal DEC, a write amplifier control signal WAE, and a sense amplifier control signal SAE based on the write enable signal WE and the clock signal CLK.

The first decoder 12, for example, includes a pre-row decoder, which selects one of a plurality of blocks, and a column decoder, which selects a bit line pair of the selected block. Since the blocks have the same configuration, only one block is illustrated in FIG. 1. The pre-row decoder generates a block selection signal BSL based on one or a plurality of bits of the row address (e.g., one high-order bit of the row address) contained in the row address signal RA. The column decoder decodes the column address signal CA to generate a column selection signal CSL.

One block includes a second decoder 13, a plurality of (two in FIG. 1) word line drivers 21 and 22, a plurality of (two in FIG. 1) memory arrays MA0 and MA1, and a word line voltage adjustment circuit 31.

The second decoder 13, in this example, is a main row decoder. The second decoder 13 operates in accordance with the block selection signal BSL, and outputs a plurality of (two in FIG. 1) word line control signals WC0 and WC1 in accordance with the row address signal RA. The number of word line control signals is set in accordance with the number of memory cells arranged in the memory arrays MA0 and MA1.

The word line driver 21 drives the word line WL0 in response to the word line control signal WC0. The word line driver 21 adjusts the potential (level) of the word line WL0 based on a level adjustment signal WLC provided from the word line voltage adjustment circuit 31. Similarly, the word line driver 22 drives the word line WL1 in response to the word line control signal WC1. The word line driver 22 adjusts the potential (level) of the word line WL1 based on the level adjustment signal WLC provided from the word line voltage adjustment circuit 31.

The memory array MA0 includes a plurality of (four in FIG. 1) memory cells (storage cells) C000, C010, C001, and C011 arrayed in a matrix form. The memory cells C000 and C001 arrayed in the row direction are coupled to the word line WL0. Similarly, the memory cells C010 and C011 arrayed in the row direction are coupled to the word line WL1. The memory cells C000 and C010 arrayed in the column direction are coupled to bit line pair B00 and xB00 (bit line B00 and inverted bit line xB00). Similarly, the memory cells C001 and C011 arrayed in the column direction are coupled to bit line pair B01 and xB01 (bit line B01 and inverted bit line xB01).

The bit line pair B00 and xB00 and the bit line pair B01 and xB01 are coupled to a column selector CS0. The column selector CS0 selects one of the bit line pairs in accordance with the column selection signal CSL output from the first decoder 12. The selected bit line pair is coupled to the write amplifier WA0 and the sense amplifier SA0. The write amplifier WA0 operates in response to the write amplifier control signal WAE, and drives the bit line pair in accordance with the input data DI0. For example, the write amplifier WA0 sets the bit line B00 to the L level (power supply voltage level on the low potential side, low potential voltage VSS in the present example), and sets the inverted bit line xB00 to the H level (power supply voltage level on the high potential side, high potential voltage VDD in the present example) in accordance with the input data DI0 of "0". The sense amplifier SA0 operates in response to the sense amplifier control signal SAE, and outputs output data DO0 corresponding to the potential at the bit line pair currently coupled to the sense amplifier SA0. For example, the sense amplifier SA0 outputs the output data DO0 of "0" based on the bit line B00 of an L level and the inverted bit line xB00 of an H level.

The bit line pair B00 and xB00 is coupled to a bit line potential detection circuit BD00, and the bit line pair B01 and xB01 is coupled to a bit line potential detection circuit BD01. The bit line potential detection circuit BD00 is coupled between the bit line B00 and the inverted bit line xB00. The bit line potential detection circuit BD00 detects the potential at the bit line B00 and the potential at the inverted bit line xB00, and outputs a detection signal DS00 having a level corresponding to the detection result. For example, the bit line potential detection circuit BD00 outputs the detection signal DS00 of a first level (e.g., L level) when a potential difference between the bit line B00 and the inverted bit line xB00 is smaller than a given value, and outputs the detection signal DS00 of a second level (e.g., H level) when the potential difference is greater than or equal to the given value. In this case, the given value, with which the potential difference of the bit line pair B00 and xB00 is compared, is set to a sufficient potential difference of the bit line pair that does not invert the storage level of the memory cells (in this case, memory cells C000 and C010), and for example, is set to one-half of the power supply voltage (potential difference between the high potential voltage VDD and the low potential voltage VSS). Similarly, the bit line potential detection circuit BD01 is coupled between the bit line B01 and the inverted bit line xB01, and outputs a detection signal DS01 having a level corresponding to the potential difference of the bit line B01 and the inverted bit line xB01.

For example, the bit line pair B00 and xB00 is pre-charged to a given potential (e.g., H level). The potential of one bit line of the bit line pair B00 and xB00 is displaced from the given potential to a potential corresponding to the input data DI0 or the stored data (holding level) of the memory cells C000 and C010. The bit line potential detection circuit BD00 outputs the detection signal DS00 of an L level, for example, when the bit line pair B00 and xB00 both have an H level, and outputs the detection signal DS00 of an H level when the potential difference of the bit line pair B00 and xB00 becomes greater than or equal to the given value. Similarly, the bit line potential detection circuit BD01 outputs the detection signal DS01 of an L level, for example, when the bit line pair B01 and xB01 both have an H level, and outputs the detection signal DS01 of an H level when the potential difference of the bit line pair B01 and xB01 becomes greater than or equal to the given value.

In a similar manner to the memory array MA0, the memory array MA1 includes a plurality of (four in FIG. 1) memory cells (storage cell) C100, C110, C101, and C111 arrayed in a matrix form. The memory cells C100 and C101 arrayed in the row direction are coupled to the word line WL0. Similarly, the memory cells C110 and C111 arrayed in the row direction are coupled to the word line WL1. The memory cells C100 and C110 arrayed in the column direction are coupled to the bit line pair B10 and xB10 (bit line B10 and inverted bit line xB10). Similarly, the memory cells C101 and C111 arrayed in the column direction are coupled to the bit line pair B11 and xB11 (bit line B11 and inverted bit line xB11).

The bit line pair B10 and xB10 and the bit line pair B11 and xB11 are coupled to a column selector CS1. The column selector CS1 selects one of the bit line pairs in accordance with the column selection signal CSL output from the first decoder 12. The selected bit line pair is coupled to the write amplifier WA1 and the sense amplifier SA1. The write amplifier WA1 operates in response to the write amplifier control signal WAE, and drives the bit line pair in accordance with input data DI1. For example, the write amplifier WA1 sets the bit line B10 to the L level (low potential voltage VSS in the present example), and sets the inverted bit line xB10 to the H level (high potential voltage VDD in the present example) in accordance with the input data DI1 of "0". The sense amplifier SA1 operates in response to the sense amplifier control signal SAE, and outputs output data DO1 corresponding to the potential at the bit line pair currently coupled to the sense amplifier SA1. For example, the sense amplifier SA1 outputs the output data DO1 of "0" based on the bit line B10 of an L level and the inverted bit line xB10 of an H level.

The bit line pair B10 and xB10 is coupled to a bit line potential detection circuit BD10, and the bit line pair B11 and xB11 is coupled to a bit line potential detection circuit BD11. The bit line potential detection circuit BD10 is coupled between the bit line B10 and the inverted bit line xB10. The bit line potential detection circuit BD10 detects the potential at the bit line B10 and the potential at the inverted bit line xB10, and outputs a detection signal DS10 having a level corresponding to the detection result. For example, the bit line potential detection circuit BD10 outputs the detection signal DS10 of a first level (e.g., L level) when a potential difference between the bit line B10 and the inverted bit line xB10 is smaller than a given value, and outputs the detection signal DS10 of a second level (e.g., H level) when the potential difference is greater than or equal to the given value. In this case, the given value, with which the potential difference of the bit line pair B10 and xB10 is compared, is set to a sufficient potential difference of the bit line pair that does not invert the storage level of the memory cells (in this case, memory cells C100 and C110), and for example, is set to one-half of the power supply voltage (potential difference between the high potential voltage VDD and the low potential voltage VSS). Similarly, the bit line potential detection circuit BD11 is coupled between the bit line B11 and the inverted bit line xB11, and outputs a detection signal DS11 having a level corresponding to the potential difference of the bit line B11 and the inverted bit line xB11.

For example, the bit line potential detection circuit BD10 outputs the detection signal DS10 of an L level, for example, when the bit line pair B10 and xB10 both have an H level, and outputs the detection signal DS10 of an H level when the potential difference of the bit line pair B10 and xB10 becomes greater than or equal to a given value. Similarly, the bit line potential detection circuit BD11 outputs the detection signal DS11 of an L level, for example, when the bit line pair B11 and xB11 both have an H level, and outputs the detection signal DS11 of an H level when the potential difference of the bit line pair B11 and xB11 becomes greater than or equal to a given value.

The word line voltage adjustment circuit 31 outputs the level adjustment signal WLC based on the detection signals DS00, DS01, DS10, and DS11 of the bit line potential detection circuits BD00, BD01, BD10, and BD11. For example, the word line voltage adjustment circuit 31 outputs the level adjustment signal WLC of an L level when at least one of the detection signals DS00, DS01, DS10, and DS11 has an L level. The word line voltage adjustment circuit 31 outputs the level adjustment signal WLC of an H level when the detection signals DS00, DS01, DS10, and DS11 have an H level.

The word line driver 21 supplies the power supply voltage on the high potential side, which is the high potential voltage VDD in the present example, to the word line WL0 in response to the level adjustment signal WLC of an H level. The word line driver 21 supplies a voltage VD1 that is lower by a given value a than the high potential voltage VDD (i.e., VD1=VDD−α) to the word line WL0 in response to the level adjustment signal WLC of an L level. Similarly, the word line driver 22 supplies the high potential voltage VDD to the word line WL1 in response to the level adjustment signal WLC of an H level. The word line driver 22 supplies the voltage VD1 to the word line WL1 in response to the level adjustment signal WLC of an L level. The voltage VD1 serves as a first voltage, and the voltage VDD serves as a second voltage.

Figure 2:
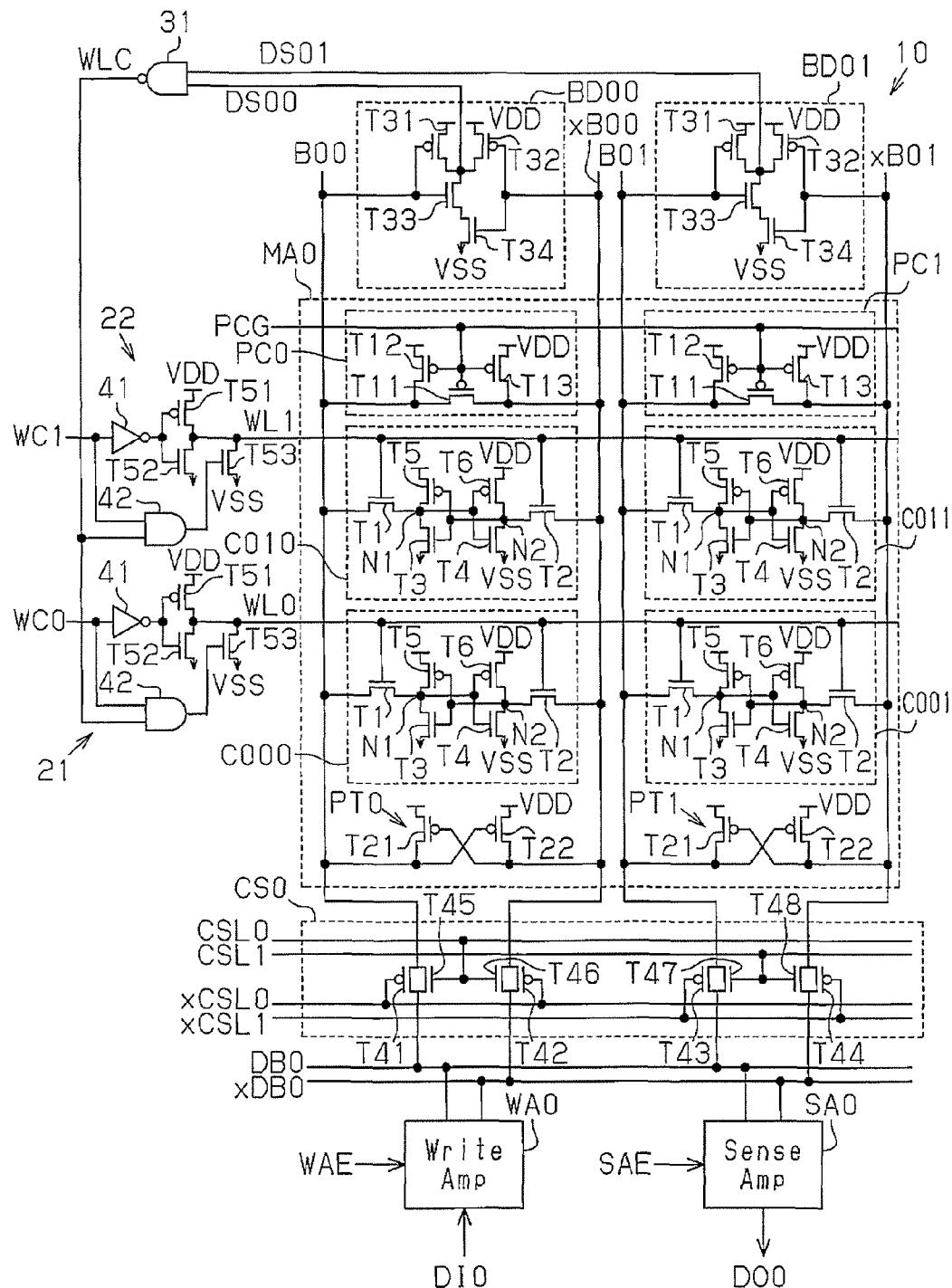
FIG. 2 is a partial circuit diagram of the semiconductor memory device in the first embodiment.

As illustrated in FIG. 2, the memory cell C000 includes six transistors T1 to T6. The transistors T1 to T4 are, for example, N-channel MOS transistors, and the transistors T5 and T6 are, for example, P-channel MOS transistors. The transistors T1 and T2 serve as accessed transistors, the transistors T3 and T4 serve as drive transistors, and the transistors T5 and T6 serve as load transistors.

The transistor T1 includes a first terminal (e.g., source terminal) coupled to the bit line B00, a second terminal (e.g., drain terminal) coupled to a drain terminal of the transistor T3 and a drain terminal of the transistor T5, and a control terminal (gate terminal) coupled to the word line WL0. The transistor T2 includes a first terminal (e.g., source terminal) coupled to the inverted bit line xB00, a second terminal (e.g., drain terminal) coupled to a drain terminal of the transistor T4 and a drain terminal of the transistor T6, and a control terminal (gate terminal) coupled to the word line WL0.

The source terminal of the transistor T3 is coupled to the wiring (hereinafter simply referred to as power supply wire VSS) to which the low potential voltage VSS (e.g., 0V) is supplied. The gate terminal of the transistor T3 is coupled to the gate terminal of the transistor T5, and is also coupled to a node N2 between the drain terminal of the transistor T4 and the drain terminal of the transistor T6. The source terminal of the transistor T5 is coupled to the wiring (hereinafter simply referred to as power supply wire VDD) to which the high potential voltage VDD is supplied.

A node N1 between the drain terminal of the transistor T5 and the drain terminal of the transistor T3 is coupled to the gate terminal of the transistor T4 and the gate terminal of the transistor T6. The source terminal of the transistor T4 is coupled to the power supply wire VSS. The source terminal of the transistor T6 is coupled to the power supply wire VDD.

In a similar manner to the memory cell C000, the memory cells C001, C010, and C011 include transistors T1 to T6. In the memory cell C010, the first terminal of the transistor T1 is coupled to the bit line B00, the first terminal of the transistor T2 is coupled to the inverted bit line xB00, and the control terminals of the transistors T1 and T2 are coupled to the word line WL1. In the memory cell C001, the first terminal of the transistor T1 is coupled to the bit line B01, the first terminal of the transistor T2 is coupled to the inverted bit line xB01, and the control terminals of the transistors T1 and T2 are coupled to the word line WL0. In the memory cell C011, the first terminal of the transistor T1 is coupled to the bit line B01, the first terminal of the transistor T2 is coupled to the inverted bit line xB01, and the control terminals of the transistors T1 and T2 are coupled to the word line WL1.

A pre-charge circuit PC0 and a protective circuit PT0 are coupled to the bit line pair B00 and xB00. The pre-charge circuit PC0 and the protective circuit PT0 are omitted in FIG. 1.

The pre-charge circuit PC0 includes transistors T11 to T13. The transistors T11 to T13 are, for example, P-channel MOS transistors. The transistor T11 includes a first terminal coupled to the bit line B00, and a second terminal coupled to the inverted bit line xB00. The transistor T12 includes a source terminal coupled to the power supply wire VDD and a drain terminal coupled to the bit line B00. The transistor T13 includes a source terminal coupled to the power supply wire VDD and a drain terminal coupled to the inverted bit line xB00. A pre-charge signal PCG is provided to the control terminals (gate terminals) of the transistors T11 to T13.

The transistors T11 to T13 are turned OFF in response to the pre-charge signal PCG of an H level, and are turned ON in response to the pre-charge signal PCG of an L level. The transistor T11 that is turned ON causes the potential at the bit line B00 to become equal to the potential at the inverted bit line xB00. The transistor T12 that is turned ON supplies the high potential voltage VDD to the bit line B00. The transistor T13 that is turned ON supplies the high potential voltage VDD to the inverted bit line xB00. Therefore, the pre-charge circuit PC0 charges the potentials at the bit line pair B00 and xB00 to the level of the high potential voltage VDD in response to the pre-charge signal PCG of an L level.

The protective circuit PT0 includes transistors T21 and T22. The transistors T21 and T22 are, for example, P-channel MOS transistors. The source terminals of the transistors T21 and T22 are coupled to the power supply wire VDD. The drain terminal of the transistor T21 is coupled to the bit line B00, and the gate terminal of the transistor T21 is coupled to the inverted bit line xB00. The drain terminal of the transistor T22 is coupled to the inverted bit line xB00, and the gate terminal of the transistor T22 is coupled to the bit line B00. The protective circuit PT0 sets at least one of the bit lines B00 and xB00 (i.e., bit line pair) to the H level. Therefore, the protective circuit PT0 prevents both bit lines B00 and xB00 from becoming L level.

Similarly, a pre-charge circuit PC1 and a protective circuit PT1 are coupled to the bit line pair B01 and xB01. The pre-charge circuit PC1 includes transistors T11 to T13. The pre-charge circuit PC1 pre-charges the potentials at the bit line pair B01 and xB01 to the level of the high potential voltage VDD in response to the pre-charge signal PCG of an L level. The protective circuit PT1 includes the transistors T21 and T22. The protective circuit PT1 prevents both lines B01 and xB01 from becoming L level.

The column selector CS0 includes transistors T41 to T48. The transistors T41 to T44 are, for example, P-channel MOS transistors, and the transistors T45 to T48 are, for example, N-channel MOS transistors. The transistor T41 includes a first terminal coupled to the bit line B00, and a second terminal coupled to a data bus DB0. The transistor T45 is coupled to the transistor T41 in parallel to form a column switch. An inverted column selection signal xCSL0 is provided to the gate terminal of the transistor T41, and a column selection signal CSL0 is provided to the gate terminal of the transistor T45. The transistor T42 includes a first terminal coupled to the inverted bit line xB00, and a second terminal coupled to an inverted data bus xDB0. The transistor T46 is coupled to the transistor T42 in parallel to form a column switch. An inverted column selection signal xCSL0 is provided to the gate terminal of the transistor T42, and a column selection signal CSL0 is provided to the gate terminal of the transistor T46.

The transistors T41 and T42 are turned ON in response to the inverted column selection signal xCSL0 of an L level, and turned OFF in response to the inverted column selection signal xCSL0 of an H level. The transistors T45 and T46 are turned ON in response to the column selection signal CSL0 of an H level, and turned OFF in response to the column selection signal CSL0 of an L level. The transistors T41 and T45 that are turned ON couple the bit line B00 to the data bus DB0. The transistors T42 and T46 that are turned ON couple the inverted bit line xB00 to the inverted data bus xDB0. The bit line pair B00 and xB00 are thereby coupled to the write amplifier WA0 and the sense amplifier SA0.

Similarly, the first terminal of the transistor T43 is coupled to the bit line B01 and the second terminal of the transistor T43 is coupled to the data bus DB0. The transistor T47 is coupled to the transistor T43 in parallel to form a column switch. An inverted column selection signal xCSL1 is provided to the gate terminal of the transistor T43, and the column selection signal CSL1 is provided to the gate terminal of the transistor T47. The first terminal of the transistor T44 is coupled to the inverted bit line xB01 and the second terminal of the transistor T44 is coupled to the inverted data bus xDB0. The transistor T48 is coupled to the transistor T44 in parallel to form a column switch. The inverted column selection signal xCSL1 is provided to the gate terminal of the transistor T44, and the column selection signal CSL1 is provided to the gate terminal of the transistor T48.

The transistors T43 and T44 are turned ON in response to the inverted column selection signal xCSL1 of an L level, and turned OFF in response to the inverted column selection signal xCSL1 of an H level. The transistors T47 and T48 are turned ON in response to the column selection signal CSL1 of an H level, and turned OFF in response to the column selection signal CSL1 of an L level. The transistors T43 and T47 that are turned ON couple the bit line B01 to the data bus DB0. The transistors T44 and T48 that are turned ON couple the inverted bit line xB01 to the inverted data bus xDB0. The bit line pair B01 and xB01 is thereby coupled to the write amplifier WA0 and the sense amplifier SA0.

The configuration of the memory array MA1 illustrated in FIG. 1 is similar to the configuration of the memory array MA0. That is, the memory cells C100, C110, C101, and C111 arranged in the memory array MA1 illustrated in FIG. 1 include the transistors T1 to T6 in a similar manner to the memory cells C000, C010, C001, and C011 illustrated in FIG. 2. Furthermore, the column selector CS1 illustrated in FIG. 1 includes transistors T41 to T48 in a similar manner to the column selector CS0 illustrated in FIG. 2. Although not illustrated in FIG. 1, the memory array MA1 includes the pre-charge circuits PC0 and PC1, and the protective circuits PT0 and PT1 illustrated in FIG. 2 in a similar manner to the memory array MA0.

As illustrated in FIG. 2, the bit line potential detection circuit BD00 includes transistors T31 to T34. The transistors T31 and T32 are, for example, P-channel MOS transistors, and the transistors T33 and T34 are, for example, N-channel MOS transistors. The source terminals of the transistors T31 and T32 are coupled to the power supply wire VDD. The drain terminals of the transistors T31 and T32 are coupled to each other, and a coupling node thereof is coupled to the drain terminal of the transistor T33. The source terminal of the transistor T33 is coupled to the drain terminal of the transistor T34, and the source terminal of the transistor T34 is coupled to the power supply wire VSS. The gate terminals of the transistors T31 and T33 are coupled to the bit line B00. The gate terminals of the transistors T32 and T34 are coupled to the inverted bit line xB00. The bit line potential detection circuit BD00 is, for example, a NAND circuit. The bit line potential detection circuit BD00 outputs the detection signal DS00 of an H level when at least one of the potential at the bit line B00 or the potential at the inverted bit line xB00 has an L level, and outputs the detection signal DS00 of an L level when the potentials of the bit lines B00 and xB00 have an H level.

Similarly, the bit line potential detection circuit BD01 includes the transistors T31 to T34, outputs the detection signal DS01 of an H level when at least one of the potential at the bit line B01 or the potential at the inverted bit line xB01 has an L level, and outputs the detection signal DS01 of an L level when the potentials of the bit lines B01 and xB01 have an H level.

The word line voltage adjustment circuit 31 is, for example, a NAND circuit. The word line voltage adjustment circuit 31 generates the level adjustment signal WLC based on the detection signals DS00 and DS01. The word line voltage adjustment circuit 31 calculates a logical sum of the detection signals DS00 and DS01, and outputs the level adjustment signal WLC having a level corresponding to the calculation result. In FIG. 2, the word line voltage adjustment circuit 31 is illustrated as a two-input element corresponding to two bit line potential detection circuits BD00 and BD01. However, the word line voltage adjustment circuit 31 has an input terminal of a number corresponding to the number of bit line potential detection circuits included in the semiconductor memory device. For example, the word line voltage adjustment circuit 31 illustrated in FIG. 1 is a NAND circuit having four input terminals corresponding to the bit line potential detection circuits BD00, BD01, BD10, and BD11.

The word line driver 21 includes an inverter circuit 41, an AND circuit 42, and transistors T51 to T53. The transistor T51 is, for example, a P-channel MOS transistor, and the transistors T52 and T53 are, for example, N-channel MOS transistors.

The word line control signal WC0 is provided to the inverter circuit 41. The output terminal of the inverter circuit 41 is coupled to the gate terminals of the transistors T51 and T52.

The source terminal of the transistor T51 is coupled to the power supply wire VDD, and the drain terminal of the transistor T51 is coupled to the drain terminal of the transistor T52. The source terminal of the transistor T52 is coupled to the power supply wire VSS. A node between the drain terminal of the transistor T51 and the drain terminal of the transistor T52 is coupled to the word line WL0.

The word line control signal WC0 and the level adjustment signal WLC are provided to the AND circuit 42. The AND circuit 42 calculates a logical product of the word line control signal WC0 and the level adjustment signal WLC, and outputs a signal having a level corresponding to the calculation result. The output terminal of the AND circuit 42 is coupled to the gate terminal of the transistor T53. The source terminal of the transistor T53 is coupled to the power supply wire VSS, and the drain terminal of the transistor T53 is coupled to the word line WL0.

The inverter circuit 41 outputs a signal of an H level in response to the word line control signal WC0 of an L level. The transistor T51 is turned OFF in response to the signal of an H level, and the transistor T52 is turned ON in response to the signal of an H level. The AND circuit 42 outputs a signal of an L level in response to the word line control signal WC0 of an L level. The transistor T53 is turned OFF in response to the signal of an L level. Therefore, when the word line control signal WC0 has an L level, the word line driver 21 couples the word line WL0 to the power supply wire VSS. The potential at the word line WL0 is thus set to the level (e.g. 0V) of the low potential voltage VSS.

The inverter circuit 41 outputs a signal of an L level in response to the word line control signal WC0 of an H level. Therefore, the transistor T51 is turned ON in response to the signal of an L level, and the transistor T52 is turned OFF in response to the signal of an L level.

The AND circuit 42 outputs the signal of an H level in response to the word line control signal WC0 of an H level and the level adjustment signal WLC of an H level. The transistor T53 is turned ON in response to the signal of an H level output from the AND circuit 42. In this case, the potential at the word line WL0 is set to a potential corresponding to the current flowing to the transistor T51 that is turned ON and the current flowing to the transistor T53 that is turned ON. This potential is voltage VD1 described above. Therefore, when the word line control signal WC0 and the level adjustment signal WLC have an H level, the word line driver 21 sets the potential at the word line WL0 to the level of the voltage VD1.

The AND circuit 42 outputs a signal of an L level in response to the word line control signal WC0 of an H level and the level adjustment signal WLC of an L level. The transistor T53 is turned OFF in response to the signal of an L level. Therefore, the word line driver 21 couples the word line WL0 to the power supply wire VDD on the high potential side. Thus, when the word line control signal WC0 has an H level and the level adjustment signal WLC has an L level, the potential at the word line WL0 is set to the level of the high potential voltage VDD.

Similarly, the word line driver 22 includes the inverter circuit 41, the AND circuit 42, and the transistors T51 to T53. The word line driver 22 sets the potential at the word line WL1 to the level of the voltage VD1 in response to the word line control signal WC1 of an H level and the level adjustment signal WLC of an H level. The word line driver 22 also sets the potential at the word line WL1 to the level of the high potential voltage VDD in response to a word line control signal WC1 of an H level and a level adjustment signal WLC of an L level.

The operation of the semiconductor memory device 10 will now be described.

In the following description, the column (bit line pair) selected in accordance with the column address signal CA is defined as the bit line pair B00 and xB00, and the non-selected column is defined as the bit line pair B01 and xB01.

Figure 3:
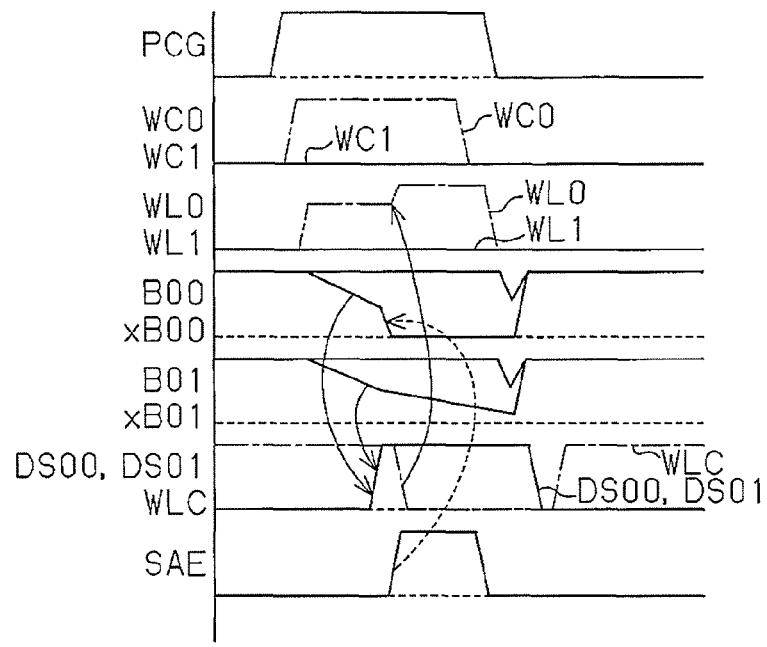
FIG. 3 is a waveform chart illustrating an operation of the semiconductor memory device in the first embodiment.

First, the read operation will be described with reference to FIG. 3. In FIG. 3, the broken line extending in a horizontal direction indicates the level of the low potential voltage VSS.

When a memory cell is not accessed (stable state), the bit line pair B00 and xB00 and the bit line pair B01 and xB01 are pre-charged to the high potential voltage VDD by the pre-charge circuits PC0 and PC1 that respond to the pre-charge signal PCG of an L level. The word lines WL0 and WL1 are set to the level of the low potential voltage VSS by the word line control signals WC0 and WC1 of an L level. The bit line potential detection circuits BD00 and BD01 output the detection signals DS00 and DS01 of an L level based on the pre-charged bit line pair B00 and xB00 and the bit line pair B01 and xB01, respectively. Therefore, the word line voltage adjustment circuit 31 outputs the level adjustment signal WLC of an H level.

When the word line control signal WC0 is set to the H level, the transistor T51 is turned ON and the transistor T52 is turned OFF in the word line driver 21. The AND circuit 42 outputs the signal of an H level in response to the word line control signal WC0 of an H level and the level adjustment signal WLC of an H level. The transistor T53 is turned ON by the signal of an H level from the AND circuit 42. The potential at the word line WL0 is then set to the level of the voltage VD1 corresponding to the current flowing to the transistors T51 and T53 that are turned ON.

In the memory cell C000 coupled to the word line WL0, the accessed transistors T1 and T2 are turned ON by the voltage VD1. Thus, the potentials at the bit line pair B00 and xB00 change in accordance with the data held at the two memory nodes N1 and N2 of the memory cell C000. In this case, the potential at the word line WL0 is the level of the voltage VD1 that is lower than the high potential voltage VDD, and the read current of the memory cell C000 is limited. Thus, the holding data of the memory cell C000 does not change.

Similarly, in the memory cell C001 coupled to the word line WL0, the accessed transistors T1 and T2 are turned ON by the voltage VD1. Thus, the potentials at the bit line pair B01 and xB01 change in accordance with the data held in the two memory nodes N1 and N2 of the memory cell C001. In this case, the potential at the word line WL0 is the level of the voltage VD1 that is lower than the high potential voltage VDD, and the read current of the memory cell C001 is limited. Thus, the holding data of the memory cell C001 does not change.

When the potential difference of the bit line pair B00 and xB00, which is the selected column, becomes greater than a given value, the bit line potential detection circuit BD00 outputs the detection signal DS00 of an H level. Similarly, when the potential difference of the bit line pair B01 and xB01, which is the non-selected column, becomes greater than the given value, the bit line potential detection circuit BD01 outputs the detection signal DS01 of an H level. The word line voltage adjustment circuit 31 outputs the level adjustment signal WLC of an L level in response to the detection signals DS00 and DS01 of an H level.

The transistor T53 of the word line driver 21 is then turned OFF by the signal of an L level output from the AND circuit 42. Therefore, the potential at the word line WL0 rises from the level of the voltage VD1 to the level of the high potential voltage VDD. In this case, the potential difference of the bit line pair B00 and xB00 is sufficiently large. In other words, the potential difference of the bit line pair B00 and xB00 is greater than or equal to a given value set as a sufficient potential difference that does not invert the holding data of the memory cell C000. The potentials at the bit line pair B00 and xB00 correspond to the holding data of the memory cell C000. Therefore, the holding data of the memory cell C000 does not change. Similarly, the potential difference of the bit line pair B01 and xB01 is sufficiently large and is greater than or equal to the given value. The potentials at the bit line pair B01 and xB01 correspond to the holding data of the memory cell C001. Therefore, the holding data of the memory cell C001 does not change.

Then, when the sense amplifier control signal SAE is set to the H level, the sense amplifier SA0 amplifies the potential difference of the bit line pair B00 and xB00, which is the selected column. The sense amplifier SA0 outputs the output data DO0 corresponding to the potentials at the bit line pair B00 and xB00.

Figure 4:
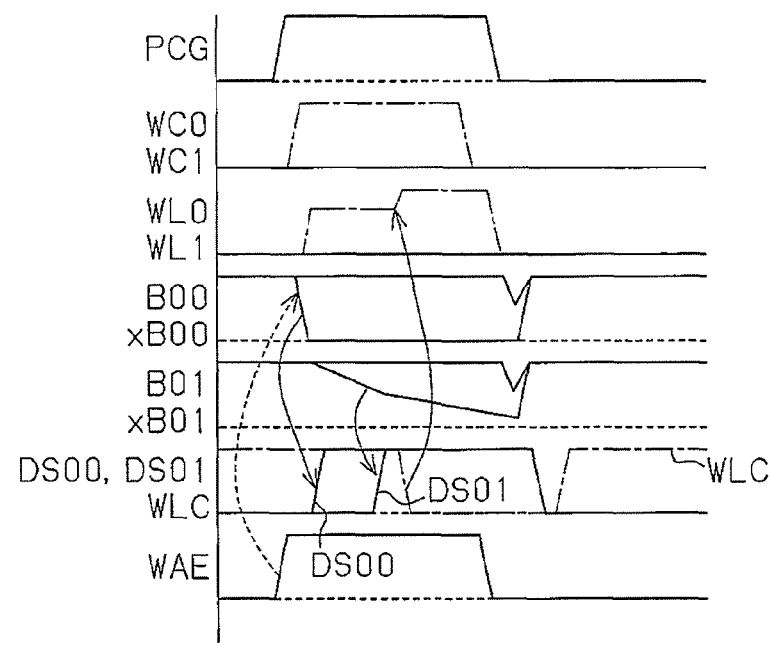
FIG. 4 is a waveform chart illustrating the operation of the semiconductor memory device in the first embodiment.

The write operation will now be described with reference to FIG. 4. In FIG. 4, a broken line extending in the horizontal direction indicates the level of the low potential voltage VSS.

When the write amplifier control signal WAE is set to the H level, the potentials at the bit line pair B00 and xB00, which is the selected column, are changed to the level of the high potential voltage VDD and the level of the low potential voltage VSS in accordance with the input data DI0 by the write amplifier WA0. The bit line potential detection circuit BD00 thus outputs the detection signal DS00 of an H level.

When the word line control signal WC0 is set to the H level, the potential at the word line WL0 is set to the level of the voltage VD1, and the writing of data starts in the memory cell C000 coupled to the word line WL0 and the bit line pair B00 and xB00.

The potentials at the bit line pair B01 and xB01, which is the non-selected column, change in accordance with the holding data of the two memory nodes N1 and N2 of the memory cell C001 coupled to the word line WL0. In this case, the potential at the word line WL0 is the level of the voltage VD1 that is lower than the high potential voltage VDD, and the read current of the memory cell C001 is limited in a similar manner to the read operation. Thus, the holding data of the memory cell C001 does not change.

When the potential difference of the bit line pair B01 and xB01 becomes greater than a given value, the bit line potential detection circuit BD01 outputs the detection signal DS01 of an H level. The word line voltage adjustment circuit 31 outputs the level adjustment signal WLC of an L level in response to the detection signals DS00 and DS01 of an H level. The transistor T53 of the word line driver 21 is then turned OFF by the signal of an L level output from the AND circuit 42. Therefore, the potential at the word line WL0 rises from the level of the voltage VD1 to the level of the high potential voltage VDD. This shifts the memory cell C000 of the selected column to a state suitable for writing, and the writing of data is completed.

In this case, the potential difference of the bit line pair B01 and xB01 is sufficiently large. In other words, the potential difference of the bit line pair B01 and xB01 is greater than or equal to a given value set as a sufficient potential difference that does not invert the holding data of the memory cell C001. The potentials at the bit line pair B01 and xB01 correspond to the holding data of the memory cell C001. Therefore, the holding data of the memory cell C001 does not change.

The first embodiment has the following advantages.

The bit line pair B00 and xB00 is coupled to the bit line potential detection circuit BD00, and the bit line pair B01 and xB01 are coupled to the bit line potential detection circuit BD01. The bit line pair B10 and xB10 is coupled to the bit line potential detection circuit BD10, and the bit line pair B11 and xB11 is coupled to the bit line potential detection circuit BD11. The bit line potential detection circuits BD00 to BD11 each output the detection signals DS00 to DS11 having a level corresponding to the potential difference of the corresponding bit line pair. The word line voltage adjustment circuit 31 outputs the level adjustment signal WLC based on the detection signals DS00 to DS11. The word line driver 21 coupled to the selected word line WL0 supplies the high potential voltage VDD or the voltage VD1 that is lower by a given value a than the high potential voltage VDD (i.e., VD1=VDD−α) to the word line WL0.

When the voltage VD1 is supplied to the word line WL0, the accessed transistors T1 and T2 are turned ON by the voltage VD1 in the memory cells C000 and C001 coupled to the word line WL0. The potentials at the bit line pair B00 and xB00 and the bit line pair B01 and xB01 thus respectively change in accordance with the data held in the memory cells C000 and C001. In this case, the potential at the word line WL0 is the level of the voltage VD1 that is lower than the level of the high potential voltage VDD, and the read current of the memory cells C000 and C001 is limited. Thus, the holding data of the memory cells C000 and C001 does not change. Therefore, in the memory cells C000 and C001, the corruption of the holding data is suppressed. In a write operation, the high potential voltage VDD is supplied to the gate terminals of the accessed transistors T1 and T2 of the selected memory cell. Therefore, the write of the data is appropriately performed on the selected memory cell.

The bit line potential detection circuits BD00 to BD11 respectively output the detection signals DS00 to DS11 having a level corresponding to the potential difference of the corresponding bit line pair. The sense amplifiers SA0 and SA1 amplify the voltage of the bit line pair coupled through the column selectors CS0 and CS1, that is, the bit line pair selected in accordance with the column address signal CA. Therefore, the power consumption of the semiconductor memory device 10 is reduced compared to when the sense amplifier is coupled to each of the bit line pairs B00, xB00 to B11, xB11.

A second embodiment will now be described with reference to FIGS. 5 to 7.

The schematic configuration of a semiconductor memory device 10a according to the second embodiment is similar to the semiconductor memory device 10 of the first embodiment. Same reference numerals are given to those components that are similar to the corresponding components of the first embodiment. Such components will not be described in detail.

Figure 5:
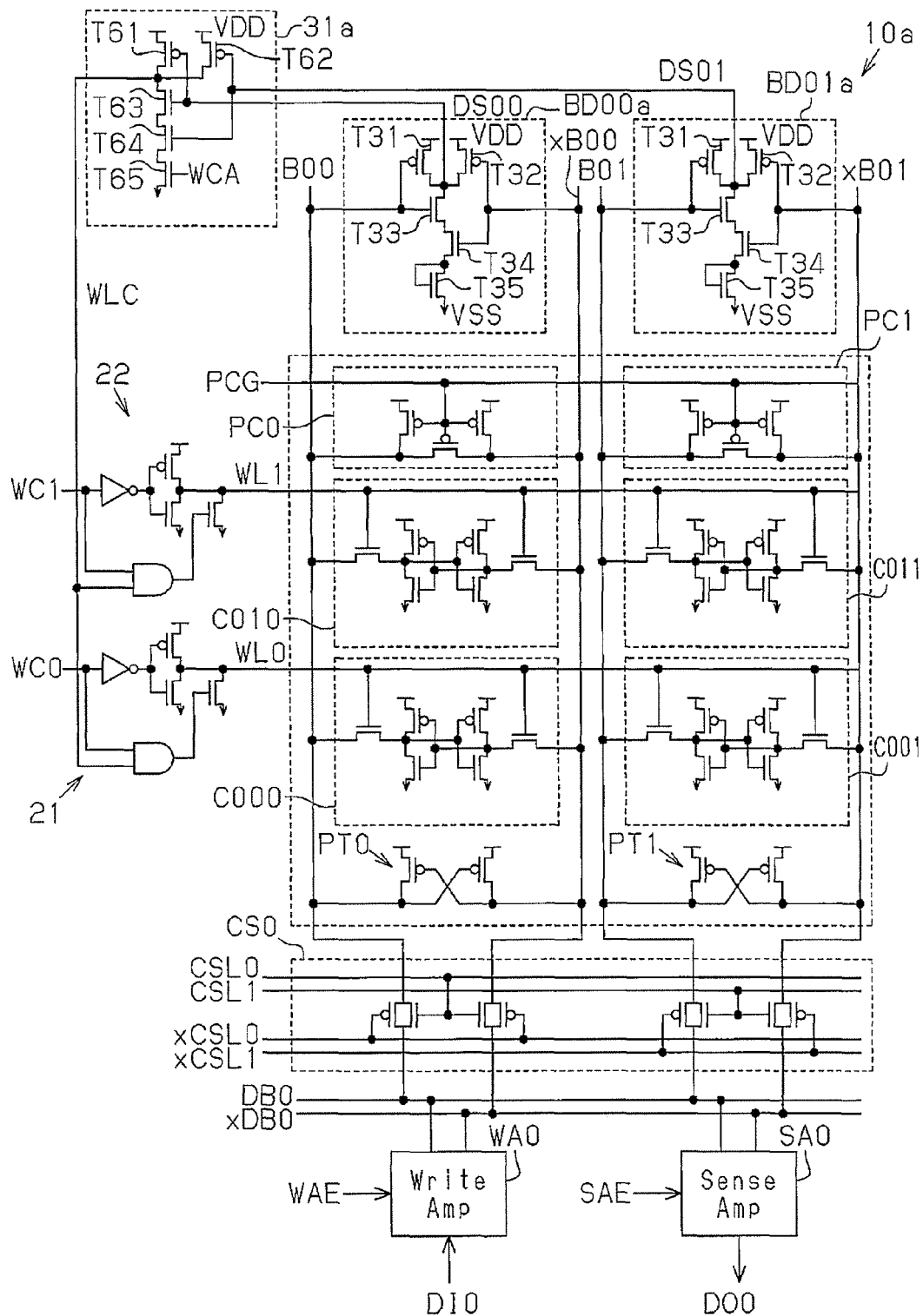
FIG. 5 is a partial circuit diagram of a semiconductor memory device in a second embodiment.
Figure 6:
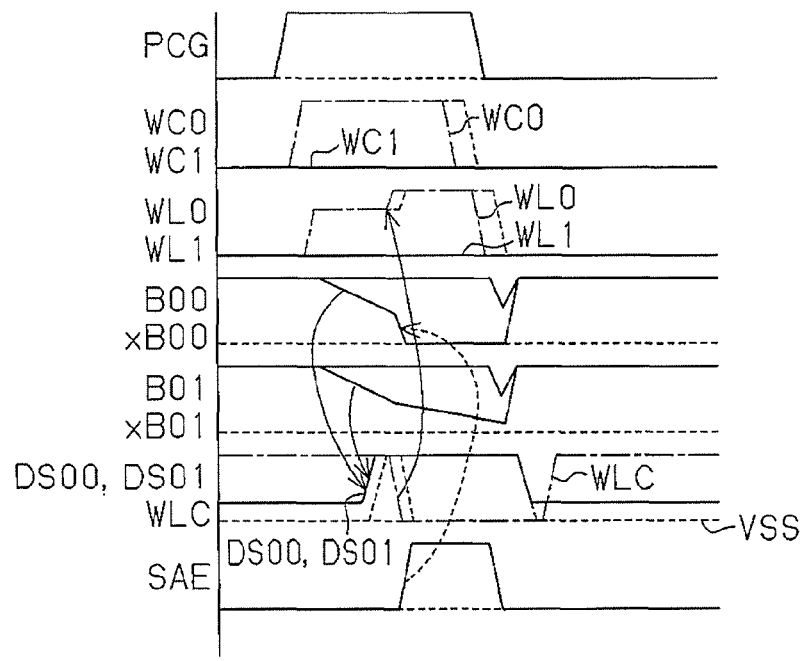
FIG. 6 is a waveform chart illustrating an operation of the semiconductor memory device in the second embodiment.

As illustrated in FIG. 5, a bit line potential detection circuit BD00a includes the transistors T31 to T35. The transistors T31 and T32 are, for example, P-channel MOS transistors, and the transistors T33 to T35 are, for example, N-channel MOS transistors. The source terminals of the transistors T31 and T32 are coupled to the power supply wire VDD. The drain terminals of the transistors T31 and T32 are coupled to each other, and a coupling node of the drain terminals is coupled to the drain terminal of the transistor T33. The source terminal of the transistor T33 is coupled to the drain terminal of the transistor T34, the source terminal of the transistor T34 is coupled to the drain terminal of the transistor T35, and the source terminal of the transistor T35 is coupled to the power supply wire VSS. The gate terminals of the transistors T31 and T33 are coupled to the bit line B00. The gate terminals of the transistors T32 and T34 are coupled to the inverted bit line xB00.

The gate terminal and the drain terminal of the transistor T35 are coupled to each other. The transistor T35 coupled in such a manner sets the source terminal voltage of the transistor T34 to the voltage VS1 that is higher than the low potential voltage VSS in accordance with a threshold value voltage of the transistor T35. Therefore, the drive capability of the transistors T33 and T34 becomes smaller than when the source terminal of the transistor T34 is coupled to the power supply wire VSS (see FIG. 2). Therefore, the timing at which the bit line potential detection circuit BD00a outputs the detection signal DS00 of an H level is earlier than the timing at which the bit line potential detection circuit BD00 illustrated in FIG. 2 outputs the detection signal DS00 of an H level. That is, the detection sensitivity of the bit line potential detection circuit BD00a for detecting the potential change of the bit line B00 or the inverted bit line xB00 from the first potential (H level in the present example), which is the pre-charge level, to the second potential (L level in the present example) is higher than the bit line potential detection circuit BD00 illustrated in FIG. 2. In the second embodiment, the transistors T33 and T34 serve as a first transistor, and the transistor T35 serves as a second transistor.

Similarly, the bit line potential detection circuit BD01a includes the transistors T31 to T35. Therefore, the bit line potential detection circuit BD01a outputs the detection signal DS01 of an H level when at least one of the potential at the bit line B01 and the potential at the inverted bit line xB01 has an L level, and outputs the detection signal DS01 of an L level when the bit line pair B01 and xB01 has an H level.

The word line voltage adjustment circuit 31a includes transistors T61 to T65. The transistors T61 and T62 are, for example, P-channel MOS transistors, and the transistors T63 to T65 are, for example, N-channel MOS transistors. The source terminals of the transistors T61 and T62 are coupled to the power supply wire VDD. The drain terminals of the transistors T61 and T62 are coupled to each other, and a coupling node thereof is coupled to the drain terminal of the transistor T63. The source terminal of the transistor T63 is coupled to the drain terminal of the transistor T64, the source terminal of the transistor T64 is coupled to the drain terminal of the transistor T65, and the source terminal of the transistor T65 is coupled to the power supply wire VSS.

The detection signal DS00 is provided to the gate terminals of the transistors T61 and T63. The detection signal DS01 is provided to the gate terminals of the transistors T62 and T64.

The word line control signal WCA is provided to the gate terminal of the transistor T65. The word line control signal WCA is provided from the second decoder 13 illustrated in FIG. 1. The second decoder 13 synthesizes (e.g., logical sum synthesis) the word line control signals WC0 and WC1 corresponding to the word lines WL0 and WL1 to generate the word line control signal WCA. In the present example, the second decoder 13 outputs the word line control signal WCA of an H level when one of the word line control signals WC0 and WC1 has an H level.

The transistor T65 is turned ON by the word line control signal WCA of an H level, and turned OFF by the word line control signal WCA of an L level. Therefore, the word line voltage adjustment circuit 31a is activated in synchronization with the activation of one of the word lines WL0 and WL1. The activated word line voltage adjustment circuit 31a calculates the logical sum of the detection signals DS00 and DS01, and outputs the level adjustment signal WLC having a level corresponding to the calculation result. The word line voltage adjustment circuit 31a is a NAND circuit activated and inactivated in accordance with the level of the word line control signal WCA.

The transistor T65 that is turned OFF prevents a through current from flowing through the word line voltage adjustment circuit 31a. As described above, each bit line potential detection circuit BD00a and BD01a includes the diode-coupled transistor T35 on the low potential side. Therefore, the detection signals DS00 and DS01 decrease to the level of the voltage VS1 that is higher than the low potential voltage VSS. The flow of the through current through the N-channel MOS transistor of the word line voltage adjustment circuit 31a by the detection signals DS00 and DS01 is prevented by turning OFF the transistor T65 with the word line control signal WCA of an L level (low potential voltage VSS). In the second embodiment, the transistors T63 and T64 serve as a third transistor, and the transistor T65 serves as a fourth transistor.

First, the read operation will be described with reference to FIG. 6. In FIG. 6, a broken line extending in the horizontal direction indicates the level of the low potential voltage VSS.

When a memory cell is not accessed (stable state), the bit line pair B00 and xB00 and the bit line pair B01 and xB01 are pre-charged to the high potential voltage VDD by the pre-charge circuits PC0 and PC1 that respond to the pre-charge signal PCG of an L level. The word lines WL0 and WL1 are set to the level of the low potential voltage VSS by the word line control signal WC0 and WC1 of an L level. The bit line potential detection circuits BD00a and BD01a output the detection signals DS00 and DS01 having a level of the voltage VS1 higher than the level of the low potential voltage VSS based on the pre-charged bit line pair B00 and xB00 and the bit line pair B01 and xB01, respectively. Therefore, the word line voltage adjustment circuit 31a outputs the level adjustment signal WLC of an H level.

When the word line control signal WC0 is set to the H level, the transistor T51 is turned ON and the transistor T52 is turned OFF in the word line driver 21. The AND circuit 42 outputs the signal of an H level in response to the word line control signal WC0 of an H level and the level adjustment signal WLC of an H level. The transistor T53 is turned ON by the signal of an H level from the AND circuit 42. The potential at the word line WL0 is then set to the level of the voltage VD1 corresponding to the current flowing to the transistors T51 and T53 that are turned ON.

In the memory cell C000 coupled to the word line WL0, the accessed transistors T1 and T2 are turned ON by the voltage VD1. Thus, the potentials at the bit line pair B00 and xB00 change in accordance with the data held at the two memory nodes N1 and N2 of the memory cell C000 (see FIG. 2). In this case, the potential at the word line WL0 is the level of the voltage VD1 that is lower than the high potential voltage VDD, and the read current of the memory cell C000 is limited. Thus, the holding data of the memory cell C000 does not change.

Similarly, in the memory cell C001 coupled to the word line WL0, the accessed transistors T1 and T2 are turned ON by the voltage VD1. Thus, the potentials at the bit line pair B01 and xB01 change in accordance with the data held at the two memory nodes N1 and N2 of the memory cell C001. In this case, the potential at the word line WL0 is the level of the voltage VD1 that is lower than the high potential voltage VDD, and the read current of the memory cell C000 is limited. Thus, the holding data of the memory cell C001 does not change.

When the potential difference of the bit line pair B00 and xB00, which is the selected column, becomes greater than a given value, the bit line potential detection circuit BD00a outputs the detection signal DS00 of an H level. In the bit line potential detection circuit BD00a, the drive capability of the transistor T34 is set to be smaller than the first embodiment. Therefore, the level of the detection signal DS00 rises at a timing earlier than the first embodiment (illustrated with broken line in FIG. 6). Similarly, when the potential difference of the bit line pair B01 and xB01, which is the non-selected column, becomes greater than the given value, the bit line potential detection circuit BD01a outputs the detection signal DS01 of an H level. In the bit line potential detection circuit BD01a, the drive capability of the transistor T34 is set to be smaller than the first embodiment. Therefore, the level of the detection signal DS01 rises at a timing earlier than the first embodiment (illustrated with broken line in FIG. 6). Therefore, the word line voltage adjustment circuit 31a outputs the level adjustment signal WLC of an L level at a timing earlier than the first embodiment (illustrated with broken line in FIG. 6) in response to the detection signals DS00 and DS01 of an H level.

The transistor T53 of the word line driver 21 is then turned OFF by the signal of an L level output from the AND circuit 42. Therefore, the potential at the word line WL0 rises from the level of the voltage VD1 to the level of the high potential voltage VDD. In this case, the potential difference of the bit line pair B00 and xB00 is sufficient and greater than or equal to a given value set as a sufficient potential difference that does not invert the holding data of the memory cell C000. The potentials at the bit line pair B00 and xB00 correspond to the holding data of the memory cell C000. Therefore, the holding data of the memory cell C000 does not change. Similarly, the potential difference of the bit line pair B01 and xB01 is sufficient and greater than or equal to the given value. The potentials at the bit line pair B01 and xB01 correspond to the holding data of the memory cell C001. Therefore, the holding data of the memory cell C001 does not change.

When the sense amplifier control signal SAE is set to the H level, the sense amplifier SA0 amplifies the potential difference of the bit line pair B00 and xB00, which is the selected column. The sense amplifier SA0 then outputs the output data DO0 corresponding to the potentials at the bit line pair B00 and xB00.

The write operation will now be described with reference to FIG. 7. In FIG. 7, a broken line extending in the horizontal direction indicates the level of the low potential voltage VSS.

Figure 7:
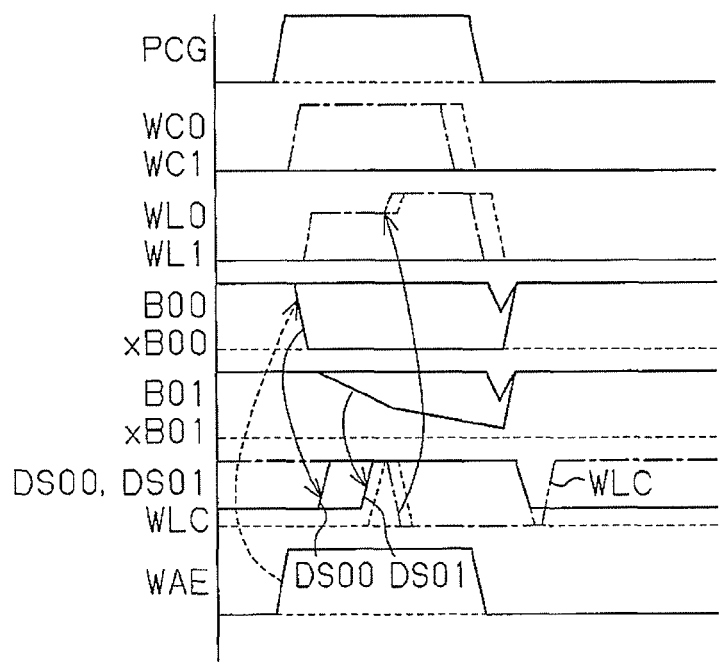
FIG. 7 is a waveform chart illustrating the operation of the semiconductor memory device in the second embodiment.

As illustrated in FIG. 7, when the write amplifier control signal WAE is set to the H level, the potentials at the bit line pair B00 and xB00, which is the selected column, are changed to the level of the high potential voltage VDD and the level of the low potential voltage VSS in accordance with the input data DI0 by the write amplifier WA0. The bit line potential detection circuit BD00a thus outputs the detection signal DS00 of an H level.

Then, when the word line control signal WC0 is set to the H level, the potential at the word line WL0 is set to the level of the voltage VD1, and the writing of data starts in the memory cell C000 coupled to the word line WL0 and the bit line pair B00 and xB00.

The potentials at the bit line pair B01 and xB01, which is the non-selected column, change in accordance with the holding data at the two memory nodes N1 and N2 of the memory cell C001 coupled to the word line WL0. In this case, in a similar manner to the read operation, the potential at the word line WL0 is the level of the voltage VD1 that is lower than the high potential voltage VDD, and the read current of the memory cell C001 is limited. Thus, the holding data of the memory cell C001 does not change.

When the potential difference of the bit line pair B01 and xB01 becomes greater than a given value, the bit line potential detection circuit BD01a outputs the detection signal DS01 of an H level. In the bit line potential detection circuit BD01a, the drive capability of the transistor T34 is set to be smaller than the first embodiment. Therefore, the level of the detection signal DS01 rises at a timing earlier than the first embodiment (illustrated with broken line in FIG. 7).

The word line voltage adjustment circuit 31a outputs the level adjustment signal WLC of an L level in response to the detection signals DS00 and DS01 of an H level. The transistor T53 of the word line driver 21 is then turned OFF by the signal of an L level output from the AND circuit 42. Therefore, the potential at the word line WL0 rises from the level of the voltage VD1 to the level of the high potential voltage VDD. This shifts the memory cell C000 of the selected column to a state suitable for writing, and the writing of data is completed.

In this case, the potential difference of the bit line pair B01 and xB01 is sufficient and greater than or equal to a given value set as a sufficient potential difference that does not invert the holding data of the memory cell C001. The potentials at the bit line pair B01 and xB01 correspond to the holding data of the memory cell C001. Therefore, the holding data of the memory cell C001 does not change.

The second embodiment has the following advantages in addition to the advantages of the first embodiment.

The bit line potential detection circuits BD00a and BD01a include the transistor T35 coupled between the transistor T34, the gate terminal of which is coupled to the inverted bit lines xB00 and xB01, and the power supply wire VSS. The transistor T35 is diode-coupled. In other words, the gate terminal and the drain terminal of the transistor T35 are coupled to each other. The transistor T35 sets the source terminal voltage of the transistor T34 to the voltage VS1 that is higher than the low potential voltage VSS in accordance with the threshold value voltage of the transistor T35. The drive capability of the transistors T33 and T34 is smaller than when the source terminal of the transistor T34 is coupled to the power supply wire VSS (see FIG. 2). Therefore, the bit line potential detection circuits BD00a and BD01a detect the change in the potentials of the bit lines B00 and B01 or the inverted bit lines xB00 and xB01 from the H level to the L level at high detection sensitivity.

The timing at which the bit line potential detection circuits BD00a and BD01a output the detection signals DS00 and DS01 of an H level in accordance with the potential difference of the bit line pair is earlier than the first embodiment. That is, the time from the start of control of the word lines WL0 and WL1 to the detection of the potentials at the bit line pair thus becomes short. Thus, the pulse width of the word line control signals WC0 and WC1 becomes short. The bit line pair B00 and xB00 and the bit line pair B01 and xB01 are pre-charged to the level of the high potential voltage VDD by the pre-charge circuits PC0 and PC1. Therefore, the potential change of the bit line is small. In other words, that is, a decrease in the potential at the bit line is suppressed by a shorter pulse width of the word line control signals WC0 and WC1, that is, a shorter the drive time of the word lines WL0 and WL1. This reduces the current amount necessary for pre-charging the bit line pair and lowers power consumption.

The word line voltage adjustment circuit 31a includes the transistor T65 coupled between the transistor T64, the gate terminal of which is provided with the detection signal DS01, and the power supply wire VSS. The word line control signal WCA is provided to the gate terminal of the transistor T65. The word line control signal WCA is set to the H level when one of the word line control signals WC0 and WC1 corresponding to the word lines WL0 and WL1 has an H level. Therefore, the through current in the word line voltage adjustment circuit 31a is prevented by turning OFF the transistor T65 with the word line control signal WCA.

A third embodiment will now be described with reference to FIGS. 8 to 11.

Same reference numerals are given to those components that are similar to the corresponding components of the first embodiment. Such components will not be described in detail.

Figure 8:
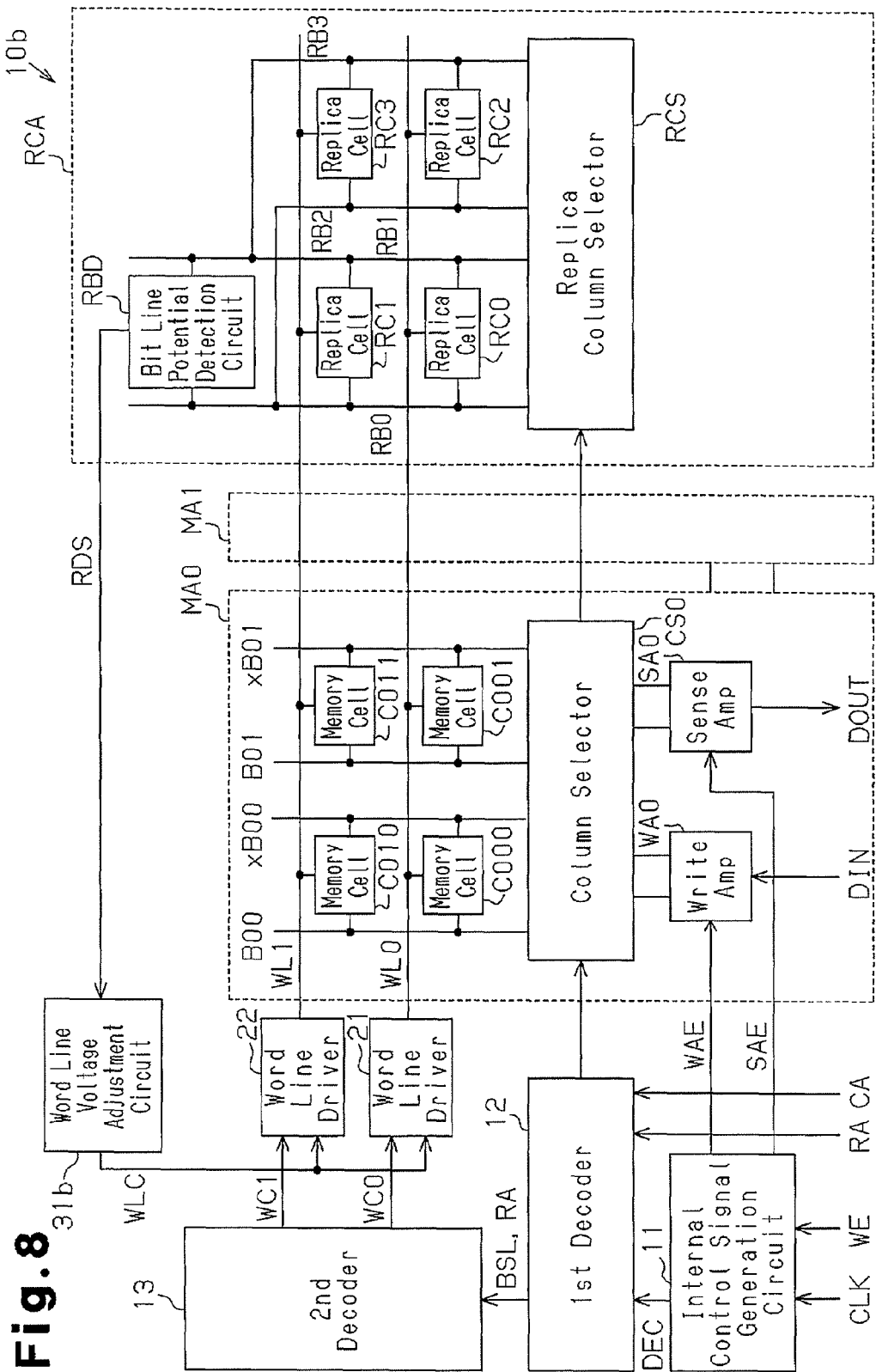
FIG. 8 is a block diagram of a semiconductor memory device in a third embodiment.

As illustrated in FIG. 8, a semiconductor memory device 10b includes a replica cell array RCA. The replica cell array RCA includes a plurality of (four in FIG. 8) replica cells RC0 to RC3 arrayed in a matrix form. The replica cells RC0 and RC2 arrayed in the row direction are coupled to the word line WL0. Similarly, the replica cells RC1 and RC3 arrayed in the row direction are coupled to the word line WL1. The replica cells RC0 and RC1 arrayed in the column direction are coupled to replica bit lines RB0 and RB1. Similarly, the replica cells RC2 and RC3 arrayed in the column direction are coupled to replica bit lines RB2 and RB3.

Each of the replica cells RC0 to RC3 has a memory node fixed at a given value (H level in the present example). Each of the replica bit lines RB0 to RB3 is pre-charged to a first potential (H level in the present example). When the word line WL0 is activated, the replica cell RC0 decreases the potentials at the replica bit lines RB0 and RB1 to a second potential (L level in the present example) in accordance with the level of the memory node. Similarly, when the word line WL1 is activated, the replica cell RC1 decreases the potentials at the replica bit lines RB0 and RB1 to the L level in accordance with the level of the memory node. Similarly, when the word lines WL0 and WL1 are activated, the replica cells RC2 and RC3 respectively decreases the potentials at the replica bit lines RB2 and RB3 to the L level in accordance with the level of the respective memory node.

The replica bit lines RB0 to RB3 are coupled to a replica column selector RCS. The replica column selector RCS includes column switches respectively coupled to the replica bit lines RB0 to RB3 in a similar manner to the column selectors CS0 and CS1. Each column switch is fixed in the OFF state.

The replica bit lines RB0 to RB3 are coupled to a bit line potential detection circuit RBD. The bit line potential detection circuit RBD detects the potentials at the replica bit lines RB0 to RB3 and outputs a detection signal RDS having a level corresponding to the detection result. For example, the bit line potential detection circuit RBD outputs the detection signal RDS of a first level (e.g. L level) when the potentials at the replica bit lines RB0 to RB3 are higher than a given value, and outputs the detection signal RDS of a second level (e.g., H level) when the potentials at the replica bit lines RB0 to RB3 are smaller than or equal to the given value. In this case, the given value, with which the potentials at the replica bit lines RB0 to RB3 are compared, is set to a sufficient potential difference of the bit line pair that does not invert the storage level of the memory cells C000 to C011, and for example, is set to one-half of the power supply voltage (potential difference of the high potential voltage VDD and the low potential voltage VSS).

A word line voltage adjustment circuit 31b outputs the level adjustment signal WLC based on the detection signal RDS output from the bit line potential detection circuit RBD.

The word line driver 21 supplies the high potential voltage VDD to the word line WL0 in response to the level adjustment signal WLC of an L level. The word line driver 21 supplies the voltage VD1 that is lower by a given value a than the high potential voltage VDD (i.e., VD1=VDD−α) to the word line WL0 in response to the level adjustment signal WLC of an H level. Similarly, the word line driver 22 supplies the high potential voltage VDD to the word line WL1 in response to the level adjustment signal WLC of an L level. The word line driver 22 supplies the voltage VD1 to the word line WL1 in response to the level adjustment signal WLC of an H level.

Figure 9:
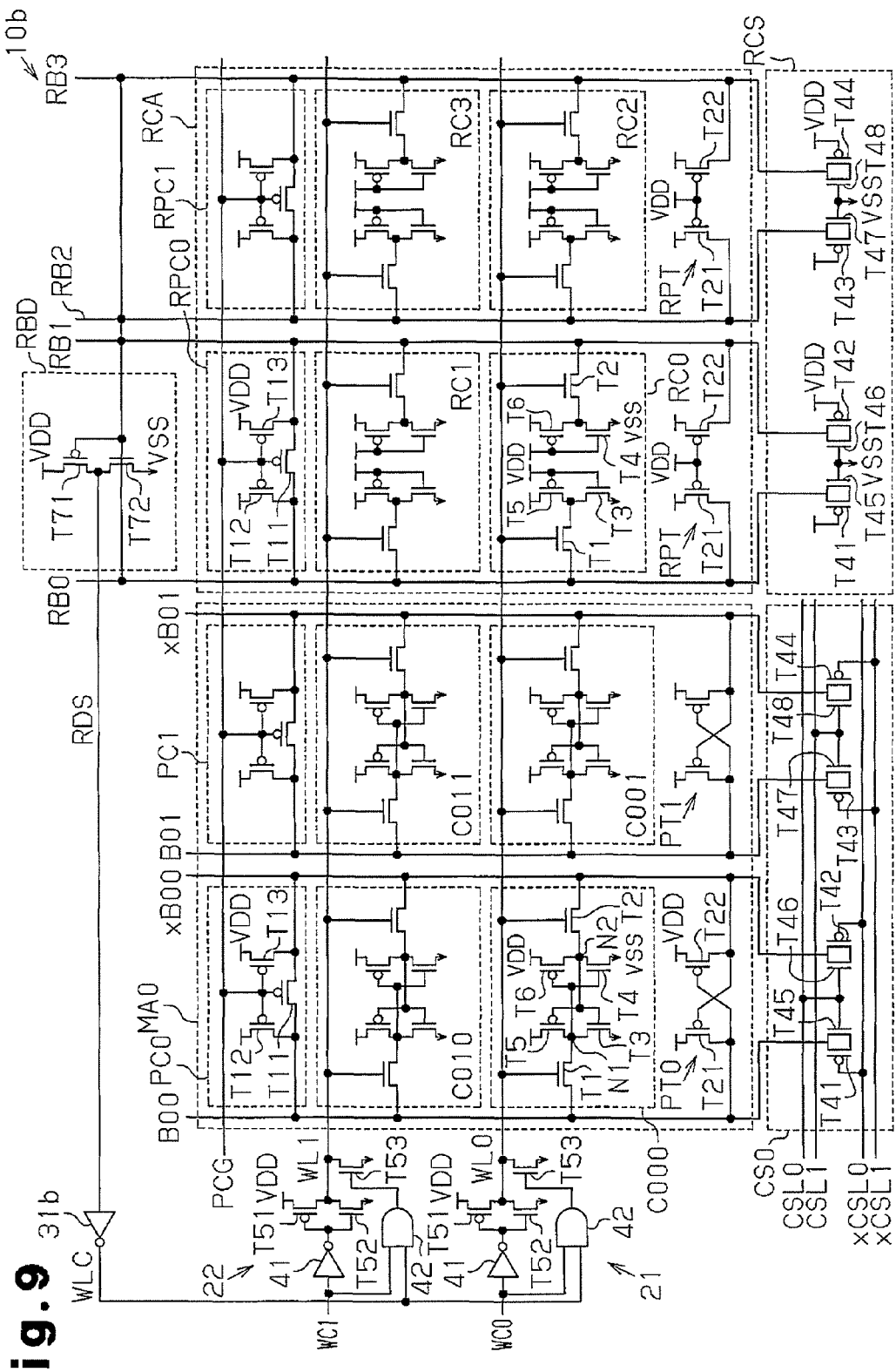
FIG. 9 is a partial circuit diagram of the semiconductor memory device in the third embodiment.

As illustrated in FIG. 9, a pre-charge circuit RPC0 is coupled between the replica bit line RB0 and the replica bit line RB1. The pre-charge circuit RPC0 includes the transistors T11 to T13 in a similar manner to the pre-charge circuits PC0 and PC1 of the memory array MA0. The two terminals (source terminal and drain terminal) of the transistor T11 are coupled to the replica bit lines RB0 and RB1, respectively. The source terminals of the transistors T12 and T13 are coupled to the power supply wire VDD. The drain terminal of the transistor T12 is coupled to the replica bit line RB0, and the drain terminal of the transistor T13 is coupled to the replica bit line RB1. A pre-charge signal PCG is provided to the gate terminals of the transistors T11 to t13.

The pre-charge circuit RPC0 pre-charges the potentials at the replica bit lines RB0 and RB1 to the H level in response to the pre-charge signal PCG of an L level. Similarly, a pre-charge circuit RPC1 coupled between the replica bit line RB2 and the replica bit line RB3 pre-charges the potentials at the replica bit lines RB2 and RB3 to the H level in response to the pre-charge signal PCG of an L level. In FIG. 9, the transistors included in the pre-charge circuit RPC1 are illustrated without reference numerals.

In a similar manner to the memory cell C000, the replica cell RC0 includes six transistors T1 to T6. The transistors T1 to T4 are, for example, N-channel MOS transistors, and T5 and T6 are, for example, P-channel MOS transistors. The transistors T1 to T6 have substantially the same electrical properties as the transistors T1 to T6 of the memory cells C000 to C011. The transistors T1 and T2 serve as accessed transistors, the transistors T3 and T4 serve as drive transistors, and the transistors T5 and T6 serve as load transistors.

In the replica cell RC0, the first terminal (e.g., source terminal) of the transistor T1 is coupled to the replica bit line RB0. The second terminal (e.g., drain terminal) of the transistor T1 is coupled to the drain terminal of the transistor T3 and the drain terminal of the transistor T5. The source terminal of the transistor T3 is coupled to the power supply wire VSS. The gate terminal of the transistor T3 and the gate terminal of the transistor T5 are coupled to the power supply wire VDD. The source terminal of the transistor T5 is coupled to the power supply wire VDD. The first terminal (e.g., source terminal) of the transistor T2 is coupled to the replica bit line RB1. The second terminal (e.g., drain terminal) of the transistor T2 is coupled to the drain terminal of the transistor T4 and the drain terminal of the transistor T6. The source terminal of the transistor T4 is coupled to the power supply wire VSS. The gate terminal of the transistor T4 and the gate terminal of the transistor T6 are coupled to the power supply wire VDD. The source terminal of the transistor T6 is coupled to the power supply wire VDD.

In the replica cell RC0, the gate terminals of the transistors T1 and T2 are coupled to the word line WL0. When the word line WL0 is activated, the transistor T1 couples the replica bit line RB0 to the transistors T3 and T5. The transistor T3 is turned ON by the high potential voltage VDD supplied to the gate terminal. The transistor T5 is turned OFF by the high potential voltage VDD supplied to the gate terminal. Therefore, when the word line WL0 is activated, the potential at the replica bit line RB0 is decreased to the L level by the transistor T3. Similarly, when the word line WL0 is activated, the transistor T2 couples the replica bit line RB1 to the transistors T4 and T6. Therefore, when the word line WL0 is activated, the potential at the replica bit line RB1 is decreased to the L level by the transistor T4. In other words, the replica cell RC0 decreases the potentials at the replica bit lines RB0 and RB1 to the L level in response to the activation of the word line WL0.

The configurations of the replica cells RC1 to RC3 are similar to the configuration of the replica cell RC0. Thus, each element is illustrated without a reference numeral in FIG. 9. The replica cell RC1 decreases the potentials at the replica bit lines RB0 and RB1 to the L level in response to the activation of the word line WL1. Similarly, the replica cell RC2 decreases the potentials at the replica bit lines RB2 and RB3 to the L level in response to the activation of the word line WL0. Further, the replica cell RC3 decreases the potentials at the replica bit lines RB2 and RB3 to the L level in response to the activation of the word line WL1.

In a similar manner to the protective circuit PT0 of the memory array MA0, the transistors T21 and T22 are respectively coupled to the replica bit line RB0 and the replica bit line RB1. The source terminals and the gate terminals of the transistors T21 and T22 coupled to the replica bit lines RB0 and RB1 are coupled to the power supply wire VDD. The drain terminal of the transistor T21 is coupled to the replica bit line RB0 and the drain terminal of the transistor T22 is coupled to the replica bit line RB1.

Similarly, the transistors T21 and T22 are respectively coupled to the replica bit line RB2 and the replica bit line RB3. The source terminals and the gate terminals of the transistors T21 and T22 coupled to the replica bit lines RB2 and RB3 are coupled to the power supply wire VDD. The drain terminal of the transistor T21 is coupled to the replica bit line RB2, and the drain terminal of the transistor T22 is coupled to the replica bit line RB3.

In a similar manner to the column selector CS0 of the memory array MA0, the replica column selector RCS includes the transistors T41 to T48. The first terminals of the transistors T41 to T44 are respectively coupled to the replica bit lines RB0 to RB3. The transistors T45 to T48 are respectively coupled to the transistors T41 to T44 in parallel. The gate terminals of the transistors T41 to T44 are coupled to the power supply wire VDD, and the gate terminals of the transistors T45 to T48 are coupled to the power supply wire VSS. A protective circuit RPT and the replica column selector RCS equalize the load on the replica cells RC0 to RC3 with the load on the memory cells C000 to C011. The potential change of the replica bit lines RB0 to RB3 thus becomes similar to the potential change of the bit lines B00, xB00, B01, and xB01.

The bit line potential detection circuit RBD includes transistors T71 and T72. The transistor T71 is, for example, a P-channel MOS transistor, and the transistor T72 is, for example, an N-channel MOS transistor. The source terminal of the transistor T71 is coupled to the power supply wire VDD, the drain terminal of the transistor T71 is coupled to the drain terminal of the transistor T72, and the source terminal of the transistor T72 is coupled to the power supply wire VSS.

The bit line potential detection circuit RBD is, for example, an inverter circuit. The input terminal of the bit line potential detection circuit RBD is coupled to the replica bit lines RB0 to RB3. Therefore, the replica bit lines RB0 to RB3 are coupled to each other. The potentials at the replica bit lines RB0 to RB3 thus become equal to each other. The average potential at the potentials at the replica bit lines RB0 to RB3 is supplied to the bit line potential detection circuit RBD. The bit line potential detection circuit RBD outputs the detection signal RDS having a potential inverted from the potentials at the replica bit lines RB0 to RB3.

The word line voltage adjustment circuit 31b is, for example, an inverter circuit. The word line voltage adjustment circuit 31b outputs the level adjustment signal WLC having a logical level inverted from the level of the detection signal RDS.

Figure 10:
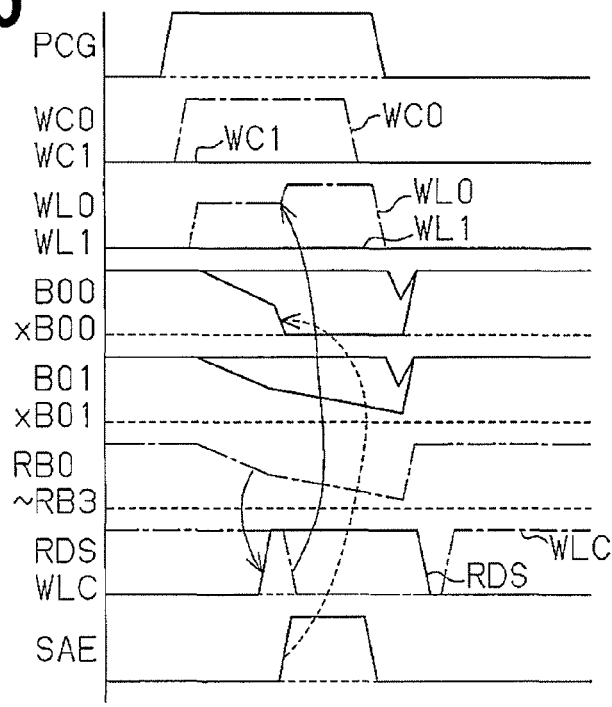
FIG. 10 is a waveform chart illustrating an operation of the semiconductor memory device in the third embodiment.

The read operation will now be described with reference to FIG. 10. In FIG. 10, a broken line extending in the horizontal direction indicates the level of the low potential voltage VSS.

When a memory cell is not accessed (stable state), the bit line pair B00 and xB00 and the bit line pair B01 and xB01 are pre-charged to the high potential voltage VDD by the pre-charge circuits PC0 and PC1 that respond to the pre-charge signal PCG of an L level. The word lines WL0 and WL1 are set to the level of the low potential voltage VSS by the word line control signals WC0 and WC1 of an L level. The bit line potential detection circuit RBD outputs the detection signal RDS having the level of the low potential voltage VSS based on the pre-charged replica bit lines RB0 to RB3. The word line voltage adjustment circuit 31b outputs the level adjustment signal WLC of an H level.

When the word line control signal WC0 is set to the H level, the word line driver 21 sets the potential at the word line WL0 to the level of the voltage VD1.

In the memory cell C000 coupled to the word line WL0, the accessed transistors T1 and T2 are turned ON by the voltage VD1. Thus, the potentials at the bit line pair B00 and xB00 change in accordance with the data held in the memory cell C000. In this case, the potential at the word line WL0 is the level of the voltage VD1 that is lower than the high potential voltage VDD, and the read current of the memory cell C000 is limited. Thus, the holding data of the memory cell C000 does not change.

Similarly, in the memory cell C001 coupled to the word line WL0, the accessed transistors T1 and T2 are turned ON by the voltage VD1. The potentials at the bit line pair B01 and xB01 thereby change in accordance with the data held in the memory cell C001. In this case, the potential at the word line WL0 is the level of the voltage VD1 that is lower than the high potential voltage VDD, and the read current of the memory cell C001 is limited. Thus, the holding data of the memory cell C001 does not change.

The potentials at the replica bit lines RB0 to RB3 are changed from the level of the high potential voltage VDD to the level of the low potential voltage VSS in a similar manner to the potential at the bit line that changes to the level of the low potential voltage VSS among the bit line pair B01 and xB01, which is the non-selected column. When the potentials at the replica bit lines RB0 to RB3 become lower than a given value, the bit line potential detection circuit RBD outputs the detection signal RDS of an H level. The word line voltage adjustment circuit 31b outputs the level adjustment signal WLC of an L level in response to the detection signal RDS of an H level.

The word line driver 21 then raises the potential at the word line WL0 from the level of the voltage VD1 to the level of the high potential voltage VDD. In this case, the potential difference of the bit line pair B00 and xB00 is sufficient and greater than or equal to a given value set as a sufficient potential difference that does not invert the holding data of the memory cell C000. The potentials at the bit line pair B00 and xB00 correspond to the holding data of the memory cell C000. Therefore, the holding data of the memory cell C000 does not change. Similarly, the potential difference of the bit line pair B01 and xB01 is sufficient and greater than or equal to a given value set as a sufficient potential difference that does not invert the holding data of the memory cell C001. The potentials at the bit line pair B01 and xB01 correspond to the holding data of the memory cell C001. Therefore, the holding data of the memory cell C001 does not change.

When the sense amplifier control signal SAE is then set to the H level, the sense amplifier SA0 amplifies the potential difference of the bit line pair B00 and xB00, which is the selected column. The sense amplifier SA0 outputs the output data DO0 corresponding to the potentials at the bit line pair B00 and xB00.

Figure 11:
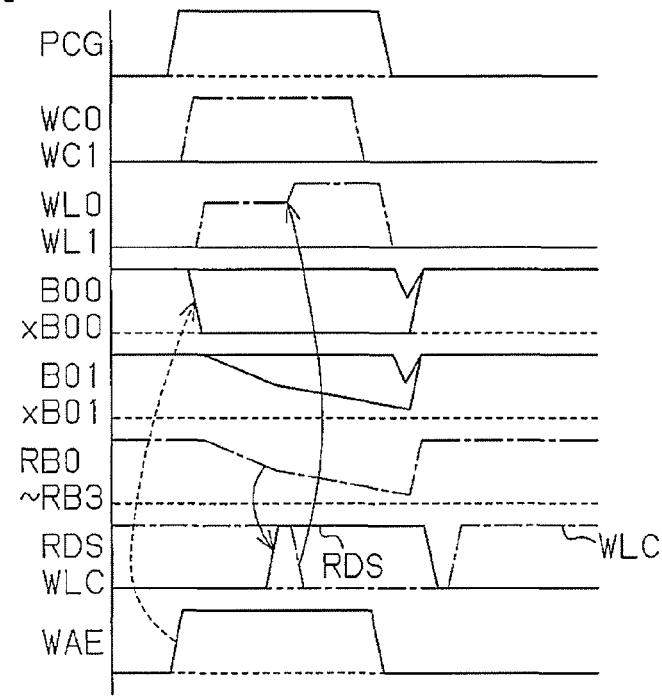
FIG. 11 is a waveform chart illustrating the operation of the semiconductor memory device in the third embodiment.

The write operation will now be described with reference to FIG. 11. In FIG. 11, a broken line extending in the horizontal direction indicates the level of the low potential voltage VSS.

When the write amplifier control signal WAE is set to the H level, the potentials at the bit line pair B00 and xB00, which is the selected column, are changed to the level of the high potential voltage VDD and the level of the low potential voltage VSS in accordance with the input data DI0 by the write amplifier WA0.

When the word line control signal WC0 is then set to the H level, the potential at the word line WL0 is set to the level of the voltage VD1, and the writing of data starts in the memory cell C000 coupled to the word line WL0 and the bit line pair B00 and xB00.

The potentials at the bit line pair B01 and xB01, which is the non-selected column, change in accordance with the holding data of the memory cell C001 coupled to the word line WL0. In this case, in a similar manner to the read operation, the potential at the word line WL0 is the level of the voltage VD1 that is lower than the high potential voltage VDD and the read current of the memory cell C001 is limited. Thus, the holding data of the memory cell C001 does not change.

When the potentials at the replica bit lines RB0 to RB3 become lower than the given value, the bit line potential detection circuit RBD outputs the detection signal RDS of an H level. The word line voltage adjustment circuit 31b outputs the level adjustment signal WLC of an L level in response to the detection signal RDS of an H level. The word line driver 21 then raises the potential at the word line WL0 from the level of the voltage VD1 to the level of the high potential voltage VDD. This shifts the memory cell C000 of the selected column to a state suitable for writing, and the writing of data is completed.

In this case, the potential difference of the bit line pair B01 and xB01 is sufficient and greater than or equal to the given value set as a sufficient potential difference that does not invert the holding data of the memory cell C001. The potentials at the bit line pair B01 and xB01 correspond to the holding data of the memory cell C001. Therefore, the holding data of the memory cell C001 does not change.

The third embodiment has the following advantages.

The replica cells RC0 and RC1 arrayed in the column direction are coupled to the replica bit lines RB0 and RB1, and the replica cells RC2 and RC3 arrayed in the column direction are coupled to the replica bit lines RB2 and RB3. The replica cells RC0 and RC2 decrease the potentials at the replica bit lines RB0 to RB3 to the L level based on the activation of the word line WL0. Similarly, the replica cells RC1 and RC3 decrease the potentials at the replica bit lines RB0 to RB3 to the L level based on the activation of the word line WL1.

The replica bit lines RB0 to RB3 are coupled to the bit line potential detection circuit RBD. The bit line potential detection circuit RBD detects the potentials at the replica bit lines RB0 to RB3, and outputs the detection signal RDS having a level corresponding to the detection result.

The potentials at the replica bit lines RB0 to RB3 are changed in a similar manner to the potential at the bit line corresponding to the level held in the memory cells C000 to C011. Therefore, the word line drivers 21 and 22 change the voltages of the word lines WL0 and WL1 from the voltage VD1 (VD1=VDD−α) to the high potential voltage VDD in response to the level adjustment signal WLC generated based on the detection signal RDS indicating the detection result of the potentials at the replica bit lines RB0 to RB3. Thus, data corruption of the memory cells C000 and C001 is prevented, and the writing of data is appropriately carried out in the write operation.

The bit line potential detection circuit RBD outputs the detection signal RDS having the level corresponding to the potentials at the replica bit lines RB0 to RB3. Therefore, parasitic elements in the bit line pair B00 and xB00 and the bit line pair B01 and xB01 selected for access are reduced compared to the first embodiment. The parasitic load capacity of the bit line is thus reduced, and the current amount required to pre-charge the bit line, that is, the power consumption in the semiconductor memory device 10b is reduced.

The bit line potential detection circuit RBD is coupled to four replica bit lines RB0 to RB3. Thus, even if a failure occurs in some of the replica cells RC0 to RC3, a potential change in the replica bit lines is detected.

A fourth embodiment will now be described with reference to FIGS. 12 to 14.

The schematic configuration of a semiconductor memory device 10c according to the fourth embodiment is similar to the semiconductor memory device 10b of the third embodiment. Same reference numerals are given to those components that are similar to the corresponding components of the semiconductor memory device 10b in the third embodiment. Such components will not be described in detail.

Figure 12:
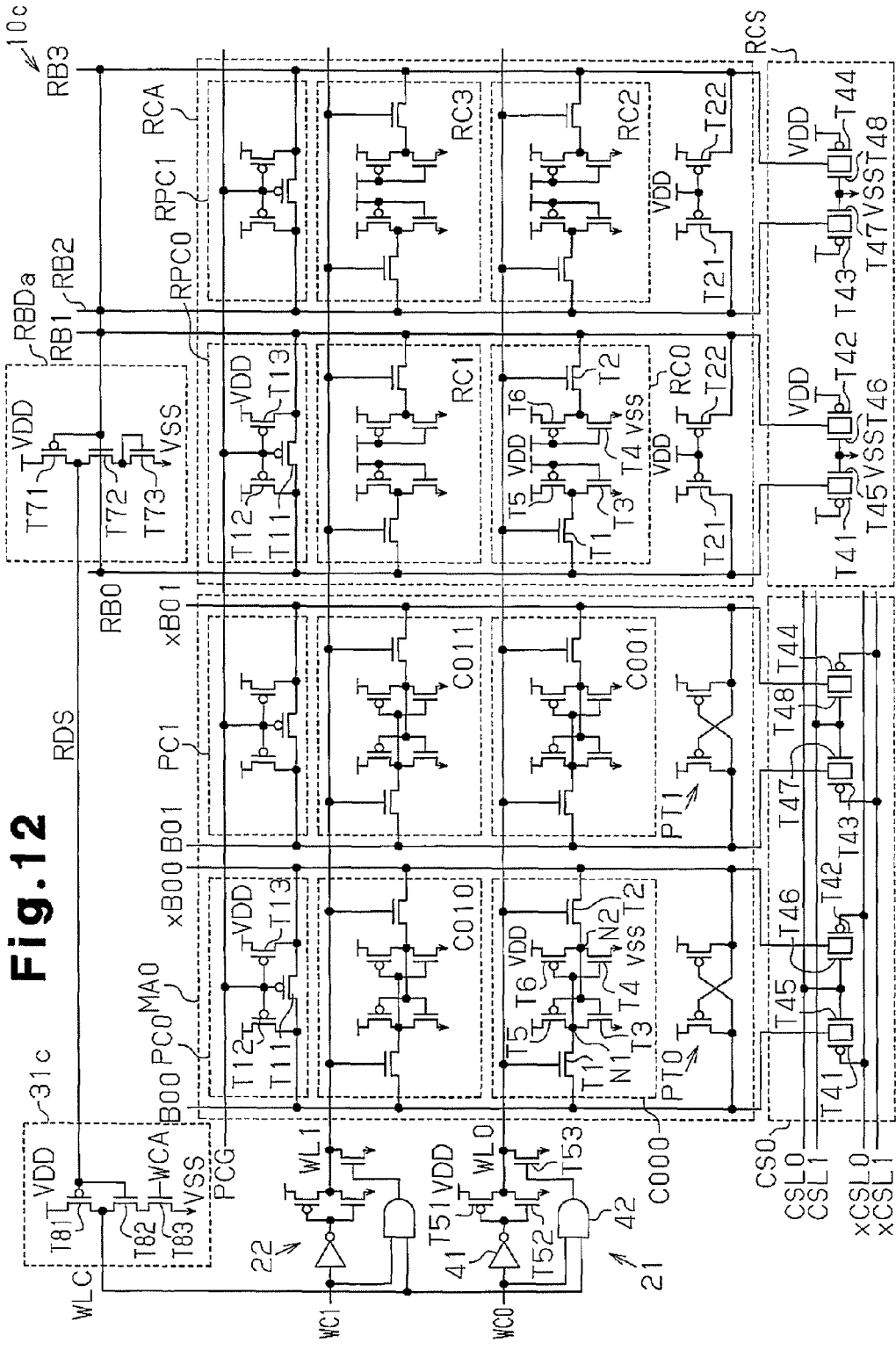
FIG. 12 is a partial circuit diagram of a semiconductor memory device in a fourth embodiment.
Figure 13:
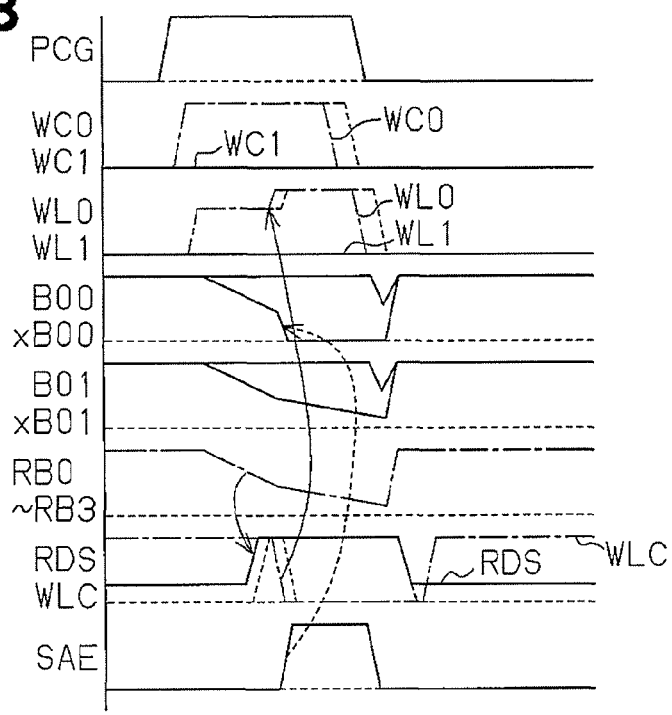
FIG. 13 is a waveform chart illustrating an operation of the semiconductor memory device in the fourth embodiment.

As illustrated in FIG. 12, a bit line potential detection circuit RBDa includes three transistors T71 to T73. The transistor T71 is, for example, a P-channel MOS transistor, and the transistors T72 and T73 are, for example, N-channel MOS transistors. The source terminal of the transistor T71 is coupled to the power supply wire VDD, and the drain terminal of the transistor T71 is coupled to the drain terminal of the transistor T72. The source terminal of the transistor T72 is coupled to the drain terminal of the transistor T73, and the source terminal of the transistor T73 is coupled to the power supply wire VSS. The gate terminals of the transistors T71 and T72 are coupled to the replica bit lines RB0 to RB3.

The gate terminal and the drain terminal of the transistor T73 are coupled to each other. The transistor T73 coupled in this manner sets the source terminal voltage of the transistor T72 to the voltage VS1 that is higher than the low potential voltage VSS in accordance with the threshold value voltage of the transistor T73. Therefore, the drive capability of the transistor T72 becomes smaller than when the source terminal of the transistor T72 is coupled to the power supply wire VSS. The timing at which the bit line potential detection circuit RBDa outputs the detection signal RDS of an H level is thus earlier than the timing at which the bit line potential detection circuit RBD illustrated in FIG. 9 outputs the detection signal RDS of an H level. That is, the detection sensitivity of the bit line potential detection circuit RBDa that detects the potential change of the replica bit lines RB0 to RB3 from the first potential (H level in the present example), which is the precharge level, to the second potential (L level in the present example) is higher than the bit line potential detection circuit RBD illustrated in FIG. 9. In the fourth embodiment, the transistor T72 serves as the first transistor, and the transistor T73 serves as the second transistor.

A word line voltage adjustment circuit 31c includes transistors T81 to T83. The transistor T81 is, for example, a P-channel MOS transistor, and the transistors T82 and T83 are, for example, N-channel MOS transistors. The source terminal of the transistor T81 is coupled to the power supply wire VDD, and the drain terminal of the transistor T81 is coupled to the drain terminal of the transistor T82. The source terminal of the transistor T82 is coupled to the drain terminal of the transistor T83, and the source terminal of the transistor T83 is coupled to the power supply wire VSS. The detection signal RDS is provided to the gate terminals of the transistors T81 and T82.

The word line control signal WCA is provided to the gate terminal of the transistor T83. The word line control signal WCA is provided from the second decoder 13 illustrated in FIG. 1. The second decoder 13 synthesizes (e.g., logical sum synthesizes) the word line control signals WC0 and WC1 corresponding to the word lines WL0 and WL1 to generate the word line control signal WCA. In the present example, when one of the word line control signals WC0 and WC1 has an H level, the second decoder 13 outputs the word line control signal WCA of an H level.

The transistor T83 is turned ON by the word line control signal WCA of an H level, and turned OFF by the word line control signal WCA of an L level. Therefore, the word line voltage adjustment circuit 31c is activated in synchronization with the activation of one of the word lines WL0 and WL1. The activated word line voltage adjustment circuit 31c outputs the level adjustment signal WLC having the logical inversion level of the level of the detection signal RDS. The word line voltage adjustment circuit 31c is an inverter circuit activated and inactivated in response to the word line control signal WCA.

The transistor T83 that is turned OFF prevents the through current in the word line voltage adjustment circuit 31c. As described above, the bit line potential detection circuit RBDa includes the diode-coupled transistor T73 on the low potential side. Therefore, the detection signal RDS lowers to the level of the voltage VS1 that is higher than the low potential voltage VSS. The flow of the through current through the N-channel MOS transistor of the word line voltage adjustment circuit 31c due to the detection signal RDS is prevented by turning OFF the transistor T83 with the word line control signal WCA of an L level (low potential voltage VSS). In the fourth embodiment, the transistor T82 serves as the third transistor, and the transistor T83 serves as the fourth transistor.

The read operation will now be described with reference to FIG. 13. In FIG. 13, a broken line extending in the horizontal direction indicates the level of the low potential voltage VSS.

When the word line control signal WC0 is set to the H level, the word line driver 21 sets the word line WL0 to the level of the voltage VD1.

In the memory cell C000 coupled to the word line WL0, the accessed transistors T1 and T2 are turned ON by the voltage VD1. Thus, the potentials at the bit line pair B00 and xB00 change in accordance with the data held at the two memory nodes N1 and N2 (see FIG. 12) of the memory cell C000. In this case, the potential at the word line WL0 is the level of the voltage VD1 that is lower than the high potential voltage VDD, and the read current of the memory cell C000 is limited. Thus, the holding data of the memory cell C000 does not change.

Similarly, in the memory cell C001 coupled to the word line WL0, the accessed transistors T1 and T2 are turned ON by the voltage VD1. The potentials at the bit line pair B01 and xB01 thereby change in accordance with the data held at the two memory nodes N1 and N2 of the memory cell C001. In this case, the potential at the word line WL0 is the level of the voltage VD1 that is lower than the high potential voltage VDD, and the read current of the memory cell C001 is limited. Thus, the holding data of the memory cell C001 does not change.

When the potential difference of the replica bit lines RB0 to RB3 becomes lower than the given value, the bit line potential detection circuit RBDa outputs the detection signal RDS of an H level. In the bit line potential detection circuit RBDa, the drive capability of the transistor T72 is set to be smaller than the third embodiment. Therefore, the level of the detection signal RDS rises at a timing earlier than in the third embodiment (indicated with a broken line in FIG. 13). Further, the word line voltage adjustment circuit 31c outputs the level adjustment signal WLC of an L level at a timing earlier than in the third embodiment (indicated with broken line in FIG. 13) in response to the detection signal RDS of an H level.

The word line driver 21 raises the potential at the word line WL0 from the level of the voltage VD1 to the level of the high potential voltage VDD. In this case, the potential difference of the bit line pair B00 and xB00 is sufficient and greater than or equal to a given value set as a sufficient potential difference that does not invert the holding data of the memory cell C000. The potentials at the bit line pair B00 and xB00 correspond to the holding data of the memory cell C000. Therefore, the holding data of the memory cell C000 does not change. Similarly, the potential difference of the bit line pair B01 and xB01 is sufficient and greater than or equal to a given value. The potentials at the bit line pair B01 and xB01 correspond to the holding data of the memory cell C001. Therefore, the holding data of the memory cell C001 does not change.

Then, when the sense amplifier control signal SAE is set to the H level, the sense amplifier SA0 amplifies the potential difference of the bit line pair B00 and xB00, which is the selected column. The sense amplifier SA0 outputs the output data DO0 corresponding to the potentials at the bit line pair B00 and xB00.

The write operation will now be described with reference to FIG. 14. In FIG. 14, a broken line extending in the horizontal direction indicates the level of the low potential voltage VSS.

Figure 14:
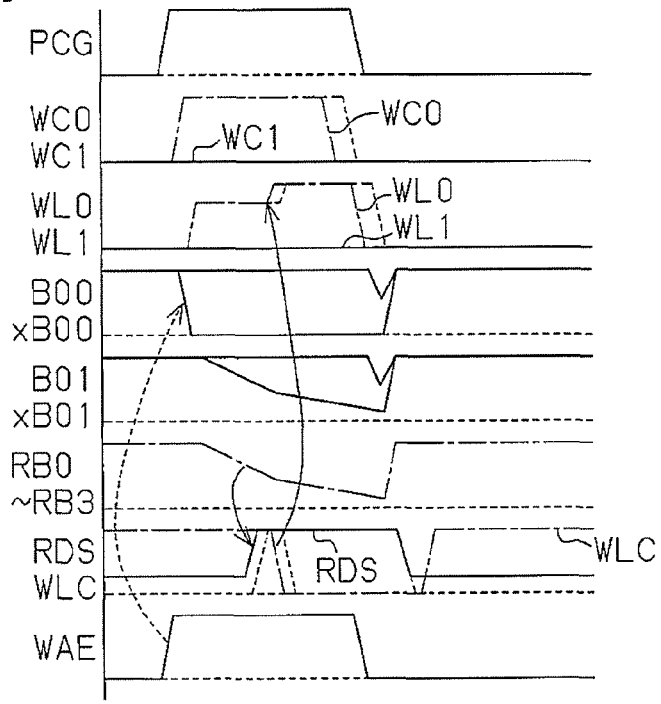
FIG. 14 is a waveform chart illustrating the operation of the semiconductor memory device in the fourth embodiment.

As illustrated in FIG. 14, when the write amplifier control signal WAE is set to the H level, the potentials at the bit line pair B00 and xB00, which is the selected column, are changed to the level of the high potential voltage VDD and the level of the low potential voltage VSS in accordance with the input data DI0 by the write amplifier WA0.

Then, when the word line control signal WC0 is set to the H level, the potential at the word line WL0 is set to the level of the voltage VD1, and the writing of data starts in the memory cell C000 coupled to the word line WL0 and the bit line pair B00 and xB00.

The potentials at the bit line pair B01 and xB01, which is the non-selected column, change in accordance with the holding data of the memory cell C001 coupled to the word line WL0. In this case, the potential at the word line WL0 is the level of the voltage VD1 that is lower than the high potential voltage VDD, and the read current of the memory cell C001 is limited in a similar manner to the read operation. Thus, the holding data of the memory cell C001 does not change.

When the potentials at the replica bit lines RB0 to RB3 become lower than the given value, the bit line potential detection circuit RBDa outputs the detection signal RDS of an H level. In the bit line potential detection circuit RBDa, the drive capability of the transistor T72 is set to be smaller than the third embodiment. Therefore, the level of the detection signal RDS rises at a timing earlier than in the third embodiment (illustrated with broken line in FIG. 14).

The word line voltage adjustment circuit 31c outputs the level adjustment signal WLC of an L level in response to the detection signal RDS of an H level. The word line driver 21 then raises the potential at the word line WL0 from the level of the voltage VD1 to the level of the high potential voltage VDD. This shifts the memory cell C000 of the selected column to a state suitable for writing, and the writing of data is completed.

In this case, the potential difference of the bit line pair B01 and xB01 is sufficient and greater than or equal to a given value set as a sufficient potential difference that does not invert the holding data of the memory cell C001. The potentials at the bit line pair B01 and xB01 correspond to the holding data of the memory cell C001. Therefore, the holding data of the memory cell C001 does not change.

The fourth embodiment has the following advantages in addition to the advantages of the third embodiment.

The bit line potential detection circuit RBDa includes the transistor 173 coupled between the transistor T72, which gate terminal is coupled to the replica bit lines RB0 to RB3, and the power supply wire VSS. The transistor T73 is diode-coupled. In other words, the gate terminal and the drain terminal of the transistor T73 are coupled to each other. The transistor T73 sets the source terminal voltage of the transistor T72 to the voltage VS1 that is higher than the low potential voltage VSS in accordance with the threshold value voltage of the transistor T73. Thus, the drive capability of the transistor 172 becomes smaller than when the source terminal of the transistor T72 is coupled to the power supply wire VSS (see FIG. 9). Therefore, the bit line potential detection circuit RBDa detects the change in the potentials at the replica bit lines RB0 to RB3 from the H level to the L level at high detection sensitivity.

Compared to the third embodiment, the timing at which the bit line potential detection circuit RBDa outputs the detection signal RDS of an H level in accordance with the potential difference of the replica bit lines becomes earlier. That is, the time from when the control of the word lines WL0 and WL1 starts to when the potential at the replica bit line is detected becomes shorter. Thus, the pulse widths of the word line control signals WC0 and WC1 become short. The replica bit lines RB0 to RB3 are pre-charged to the level of the high potential voltage VDD by the pre-charge circuits RPC0 and RPC1. Therefore, shorter pulse widths of the word line control signals WC0 and WC1, that is, shorter drive time of the word lines WL0 and WL1 decreases potential changes in the replica bit lines RB0 to RB3, that is, reduces potential decreases at the replica bit lines RB0 to RB3. Thus, the current amount necessary for pre-charging the replica bit lines RB0 to RB3 becomes small, and the power consumption is suppressed.

The word line voltage adjustment circuit 31c includes the transistor T83 coupled between the transistor T82, to which gate the detection signal RDS is provided, and the power supply wire VSS. The word line control signal WCA is provided to the gate terminal of the transistor T83. The word line control signal WCA is set to the H level when one of the word line control signals WC0 and WC1 corresponding to the word lines WL0 and WL1 has an H level. Therefore, the through current in the word line voltage adjustment circuit 31c is prevented by turning OFF the transistor T83 with the word line control signal WCA.

It should be apparent to those skilled in the art that the present invention may be embodied in many other specific forms without departing from the scope of the invention. Particularly, it should be understood that the invention may be embodied in the following forms.

In the first and second embodiments, the number of bit line potential detection circuits coupled to the bit line pair may be changed. For example, in a memory array including three or more bit line pairs, the bit line potential detection circuit may be coupled to at least two bit line pairs. In such a configuration, for example, when at least either one of the two bit line pairs coupled to the bit line potential detection circuit is a non-selected column, data corruption of the memory cell may be suppressed in a similar manner to the first and second embodiments. Furthermore, data may be written to the memory cell in the write operation. Power consumption in the semiconductor memory device may also be reduced.

In the third and fourth embodiments, the number of replica bit lines coupled to the bit line potential detection circuits RBD and RBDa may be changed.

In each of the above embodiments, after the potential of the word line (e.g., WL0), that is, the output voltage of each of the word line drivers 21 and 22 is changed from the voltage VD1 (first voltage) to the voltage VDD (second voltage), the sense amplifier control signal SAE is activated to operate the sense amplifier SA0. However, even before the potential of the word line is changed to the voltage VDD, the sense amplifier SA0 may perform the read operation as long as the signals output to the data bus DB0 and the inverted data bus xDB0 have a given amplitude.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments of the present invention have been described in detail, it should be understood that various changes, substitutions, and alterations could be made hereto without departing from the spirit and scope of the invention.

The invention claimed is:

1. A semiconductor memory device comprising:
a plurality of word lines;
a plurality of bit line pairs intersecting the word lines;
a plurality of memory cells arranged in correspondence with positions where the word lines and the bit line pairs intersect;
a word line driver arranged in correspondence with one of the word lines, wherein the word line driver outputs a first voltage or a second voltage that is higher than the first voltage;
a potential detection circuit arranged in correspondence with at least one of the bit line pairs, wherein the potential detection circuit is a NAND circuit that detects a potential difference of the at least one bit line pair and generates a detection signal in accordance with the potential difference;
a word line voltage adjustment circuit that changes an output voltage of the word line driver from the first voltage to the second voltage in accordance with the detection signal from the potential detection circuit; and
a sense amplifier that amplifies a potential difference of a selected one of the bit line pairs for access,
wherein the potential detection circuit includes
a first transistor coupled to one of the bit line pairs, and
a second transistor coupled between the first transistor and a low potential power supply wire, wherein the second transistor is a diode-coupled transistor.

2. The semiconductor memory device according to claim 1, wherein
each of the memory cells includes two memory nodes that hold different levels, and changes a potential at a corresponding one of the bit line pairs in accordance with the levels held by the two memory nodes based on the first voltage supplied to a corresponding one of the word lines; and
the potential detection circuit generates the detection signal in accordance with a potential difference of the corresponding bit line pair.

3. The semiconductor memory device according to claim 1, wherein
the potential detection circuit is one of a plurality of potential detection circuits coupled to the plurality of bit line pairs;
the word line voltage adjustment circuit generates a level adjustment signal based on a plurality of detection signals generated by the potential detection circuits; and
the word line driver changes the voltage of a corresponding one of the word lines based on the level adjustment signal.

4. The semiconductor memory device according to claim 1, wherein
the memory cells includes
a storage cell including two memory nodes that hold different levels, and
a replica cell that lowers a potential at a corresponding one of the bit line pairs from a first potential based on the first voltage supplied to a corresponding one of the word lines;
the sense amplifier amplifies the potential difference of the bit line pair selected for access to the storage cell; and
the potential detection circuit generates the detection signal in accordance with the potential of at least one replica bit line coupled to the replica cell.

5. The semiconductor memory device according to claim 4, wherein
the word line voltage adjustment circuit generates a level adjustment signal based on the detection signal of the potential detection circuit coupled to the at least one replica bit line; and
the word line driver changes the voltage of a corresponding one of the word lines based on the level adjustment signal.

6. The semiconductor memory device according to claim 1, wherein
the word line voltage adjustment circuit includes
a third transistor that operates in response to the detection signal of the potential detection circuit, and
a fourth transistor coupled between the third transistor and a low potential power supply wire, wherein the fourth transistor operates in response to a control signal corresponding to activation of the word line driver.

7. A method for controlling a semiconductor memory device including a plurality of memory cells arranged in correspondence with positions where a plurality of word lines and a plurality of bit line pairs intersect, the method comprising:
driving one of the word lines at a first voltage;
detecting, by a potential detection circuit that is a NAND circuit, a potential difference of at least one of the bit line pairs and generating a detection signal in accordance with the potential difference;
changing a drive voltage of the one of the word lines from the first voltage to a second voltage that is higher than the first voltage in accordance with the detection signal; and
amplifying a potential difference of a selected one of the bit line pairs for access,
wherein the potential detection circuit includes
a first transistor coupled to one of the bit line pairs, and
a second transistor coupled between the first transistor and a low potential power supply wire, wherein the second transistor is a diode-coupled transistor.

8. A semiconductor memory device comprising:
a plurality of word lines;
a plurality of bit line pairs intersecting the word lines;
a plurality of memory cells arranged in correspondence with positions where the word lines and the bit line pairs intersect;
a word line driver arranged in correspondence with one of the word lines, wherein the word line driver outputs a first voltage or a second voltage that is higher than the first voltage;
a potential detection circuit arranged in correspondence with at least one of the bit line pairs, wherein the potential detection circuit detects a potential at the at least one bit line pair and generates a detection signal;
a word line voltage adjustment circuit that changes an output voltage of the word line driver from the first voltage to the second voltage in accordance with the detection signal from the potential detection circuit; and
a sense amplifier that amplifies a potential difference of a selected one of the bit line pairs for access, wherein the potential detection circuit includes
- a first transistor coupled to one of the bit line pairs, and
- a second transistor coupled between the first transistor and a low potential power supply wire, wherein the second transistor is a diode-coupled transistor.

9. The semiconductor memory device according to claim 8, wherein
- each of the memory cells includes two memory nodes that hold different levels, and changes a potential at a corresponding one of the bit line pairs in accordance with the levels held by the two memory nodes based on the first voltage supplied to a corresponding one of the word lines; and
- the potential detection circuit generates the detection signal in accordance with a potential difference of the corresponding bit line pair.

10. The semiconductor memory device according to claim 8, wherein
- the potential detection circuit is one of a plurality of potential detection circuits coupled to the plurality of bit line pairs;
- the word line voltage adjustment circuit generates a level adjustment signal based on a plurality of detection signals generated by the potential detection circuits; and
- the word line driver changes the voltage of a corresponding one of the word lines based on the level adjustment signal.

11. The semiconductor memory device according to claim 8, wherein
the memory cells includes
- a storage cell including two memory nodes that hold different levels, and
- a replica cell that lowers a potential at a corresponding one of the bit line pairs from a first potential based on the first voltage supplied to a corresponding one of the word lines;
the sense amplifier amplifies the potential difference of the bit line pair selected for access to the storage cell; and
the potential detection circuit generates the detection signal in accordance with the potential of at least one replica bit line coupled to the replica cell.

12. The semiconductor memory device according to claim 11, wherein
- the word line voltage adjustment circuit generates a level adjustment signal based on the detection signal of the potential detection circuit coupled to the at least one replica bit line; and
- the word line driver changes the voltage of a corresponding one of the word lines based on the level adjustment signal.

13. The semiconductor memory device according to claim 8, wherein
the word line voltage adjustment circuit includes
- a third transistor that operates in response to the detection signal of the potential detection circuit, and
- a fourth transistor coupled between the third transistor and a low potential power supply wire, wherein the fourth transistor operates in response to a control signal corresponding to activation of the word line driver.

* * * * *